US012696776B2

(12) United States Patent
Shan et al.

(10) Patent No.: US 12,696,776 B2
(45) Date of Patent: Jul. 28, 2026

(54) GLASS SUBSTRATE DEVICE WITH EMBEDDED COMPONENTS

(71) Applicant: Intel Corporation, Santa Clara, CA (US)

(72) Inventors: Bohan Shan, Chandler, AZ (US); Haobo Chen, Chandler, AZ (US); Yiqun Bai, Chandler, AZ (US); Dingying Xu, Chandler, AZ (US); Srinivas Venkata Ramanuja Pietambaram, Chandler, AZ (US); Hongxia Feng, Chandler, AZ (US); Gang Duan, Chandler, AZ (US); Xiaoying Guo, Chandler, AZ (US); Ziyin Lin, Chandler, AZ (US); Bai Nie, Chandler, AZ (US); Kyle Jordan Arrington, Gilbert, AZ (US); Jeremy D. Ecton, Gilbert, AZ (US); Brandon C. Marin, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/086,293

(22) Filed: Dec. 21, 2022

(65) Prior Publication Data

US 2024/0213170 A1 Jun. 27, 2024

(51) Int. Cl.
*H10W 70/60* (2026.01)
*H10B 80/00* (2026.01)
(Continued)

(52) U.S. Cl.
CPC .......... *H10W 70/614* (2026.01); *H10B 80/00* (2023.02); *H10W 70/611* (2026.01);
(Continued)

(58) Field of Classification Search
CPC ....................................................... H10D 1/20
See application file for complete search history.

(56) References Cited

U.S. PATENT DOCUMENTS

2015/0250058 A1 9/2015 Ramachandran et al.
2020/0066830 A1* 2/2020 Bharath ................... H10D 1/20
(Continued)

FOREIGN PATENT DOCUMENTS

KR 20120057285 6/2012

OTHER PUBLICATIONS

International Search Report and Written Opinion from PCT/US2023/033719 notified Jan. 16, 2024, 10 pgs.
(Continued)

*Primary Examiner* — Christine S. Kim
*Assistant Examiner* — Cole Leon Lindsey
(74) *Attorney, Agent, or Firm* — Essential Patents Group, LLP

(57) ABSTRACT

An electronic system includes a substrate and a top surface active component die. The substrate includes a glass core layer having a glass core layer active component die disposed in a cavity and a discrete passive component disposed in another cavity; a mold layer including a mold layer active component die disposed in the mold layer; and a buildup layer contacting a top surface of the glass core layer and a bottom surface of the mold layer. The buildup layer includes electrically conductive interconnect connecting the glass core layer active component die, the discrete passive component, and the mold layer active component die. The top surface of the component die is electrically connected to the mold layer active component die.

20 Claims, 19 Drawing Sheets

(51) Int. Cl.
  *H10W 70/65*    (2026.01)
  *H10W 72/20*    (2026.01)
  *H10W 72/90*    (2026.01)
  *H10W 90/00*    (2026.01)

(52) U.S. Cl.
  CPC ........... *H10W 70/65* (2026.01); *H10W 90/00*
    (2026.01); *H10W 90/701* (2026.01); *H10W*
    *72/242* (2026.01); *H10W 72/923* (2026.01);
          *H10W 72/952* (2026.01)

(56)       References Cited

U.S. PATENT DOCUMENTS

| | | | |
|---|---|---|---|
| 2020/0312767 A1* | 10/2020 | Pietambaram | ...... H10W 70/611 |
| 2022/0157676 A1 | 5/2022 | Kim et al. | |
| 2022/0352076 A1 | 11/2022 | Ecton et al. | |
| 2022/0375865 A1 | 11/2022 | Pietambaram et al. | |
| 2022/0406736 A1* | 12/2022 | Marin | ...................... H10D 1/20 |

OTHER PUBLICATIONS

International Preliminary Report on Patentability from PCT/US2023/033719 notified Jul. 3, 2025, 7 pgs.

* cited by examiner

110

104

112

106

114

118

108

120

122

116

102

GLASS SUBSTRATE DEVICE WITH EMBEDDED COMPONENTS

TECHNICAL FIELD

Embodiments pertain to packaging of electronic systems. Some embodiments relate to techniques of embedding electronic devices in a glass package substrate.

BACKGROUND

Electronic systems continue to increase in complexity while it is desired to keep their size small. This leads to increased density of electronic circuits by reducing their size to include more circuits in the same size or smaller package. Thermal management in electronic systems continues to be a challenge that grows with the increasingly complicated architectures and higher power parts.

BRIEF DESCRIPTION OF THE DRAWINGS

FIGS. 2A-2H illustrate a flow diagram of an example of a method of manufacture of a substrate for an electronic system in accordance with some embodiments;

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

To meet the demand for increased functional complexity in smaller devices, manufacturers integrate multiple integrated circuit (IC) dies in a single electronic package to create an efficient electronic system in a package. Electronic packaging can include a substrate core upon which interconnect build-up layers are formed with interconnect for ICs of the packed electronic system. As manufacturers continue to increase circuit density, thermal management and power management in electronic packaging becomes challenging.

Typically, all the dies included in the electronic package are placed on the top surface of the substrate of an electronic package and the dies are connected using interconnecting bridges or a base interposer. This two-dimensional approach to electronic package can negatively impact the potential performance of parts due to thermal crosstalk. In thermal crosstalk, dies that are higher power and hotter heat up lower power dies resulting in thermal throttling. Also, the two-dimensional approach typically has all the inputs and power coming from the top surface of the substrate.

Figure 1:
FIG. 1 is an illustration of a cross section side view of an example of a substrate for an electronic system in accordance with some embodiments.

FIG. 1 is an illustration of a cross section side view of an example of a substrate 102 for an electronic system. The substrate 102 includes a glass core layer 104. The glass core layer 104 may include a silicate-based glass (e.g., lithium-silicate, borosilicate, aluminum silicate, etc.). In variations, the glass of the glass core layer is a lower quality glass (e.g., glass made with soda lime), or a higher quality glass (e.g., quartz glass made with fused silica).

One or more cavities 106 are formed in the glass core layer 104 and at least one active component die 108 is disposed in each of the cavities 106. An active component die 108 includes multiple active circuit components, such as multiple transistors. An active component die 108 can also include passive circuit components (e.g., capacitors, inductors, and resistors). As an example intended to be non-limiting, the active component die 108 can be a memory die, such as a high bandwidth memory (HBM) component die. In some examples, multiple memory die can be disposed in the cavity as a stack of the memory die.

The substrate 102 includes top buildup layers 110 on the top surface of the glass core layer 104, and bottom buildup layers 112 on the bottom surface of the glass core layer 104. The top buildup layers 110 include electrically conductive interconnect. The electrically conductive interconnect can include metal vias 114 and metal traces. The electrically conductive interconnect contacts the active component die 106 disposed in the cavity and extends to the top surface of the substrate 102, where the interconnect may contact another component to provide electrical continuity between the components. In the example of FIG. 1, the active component die 108 extends beyond the cavity 106 within the glass core layer 104 into the top buildup layers 110 and the bottom buildup layers 112. In variations, the active component die 108 does not extend beyond the surfaces of the glass core layer 104.

In some examples, the electrically conductive interconnect can include a multi-die interconnect bridge (MIB) 122 embedded in the buildup layers. The MIB 122 is a small component with features created using a lithography process. The MIB 122 can include a silicon material or an organic material. The MIB 122 includes electrically conductive interconnect with features having a finer pitch and higher density than the buildup layers. The MIB 122 provides very high density die-to-die connections where it is needed in the substrate 102.

The MIB 122 can provide electrical continuity between at least one input/output (I/O) pad of the active component die 108 disposed in the cavity 106 and at least one I/O pad of another component mounted on the top surface of the substrate 102. In the example of FIG. 1, the bottom side of the MIB 122 is electrically connected to the top side of the active component die 108, and the top side of the MIB 122 would be electrically connected to the other component on the top of the substrate.

The bottom surface of the bottom buildup layers 112 is the bottom surface of the substrate 102. The substrate 102 includes solder bumps 116 on the bottom surface. Some of the solder bumps may contact the bottom of the active component die 108. The example of FIG. 1 shows one solder bump formation 118 having a larger size than the other solder bumps 116. The smaller solder bumps 116 may be ball grid array (BGA) solder pumps for carrying electrical signals. The larger solder bump formation 118 can carry thermals away from the substrate 102 and can be attached to a cooling structure such as one or more thermal-carrying metal slugs included in a motherboard. The bottom side of the active component die 108 can include a solderable metallization layer 120 to bond to the larger solder bump formation 118. The solderable metallization layer 120 can include one or both of titanium and nickel. The solderable metallization layer 120 can include a gold surface.

In some examples, all the solder bumps 116 on the bottom surface of the substrate 102 are the smaller size solder bumps 116. Some of the solder bumps 116 on the bottom surface can be electrically connected to the active comment die 108. The solder bumps 116 can be used to route one or more power inputs to the active component die 108, and the power routing can be removed from the top surface of the substrate 102.

Figures 2A, 2B:
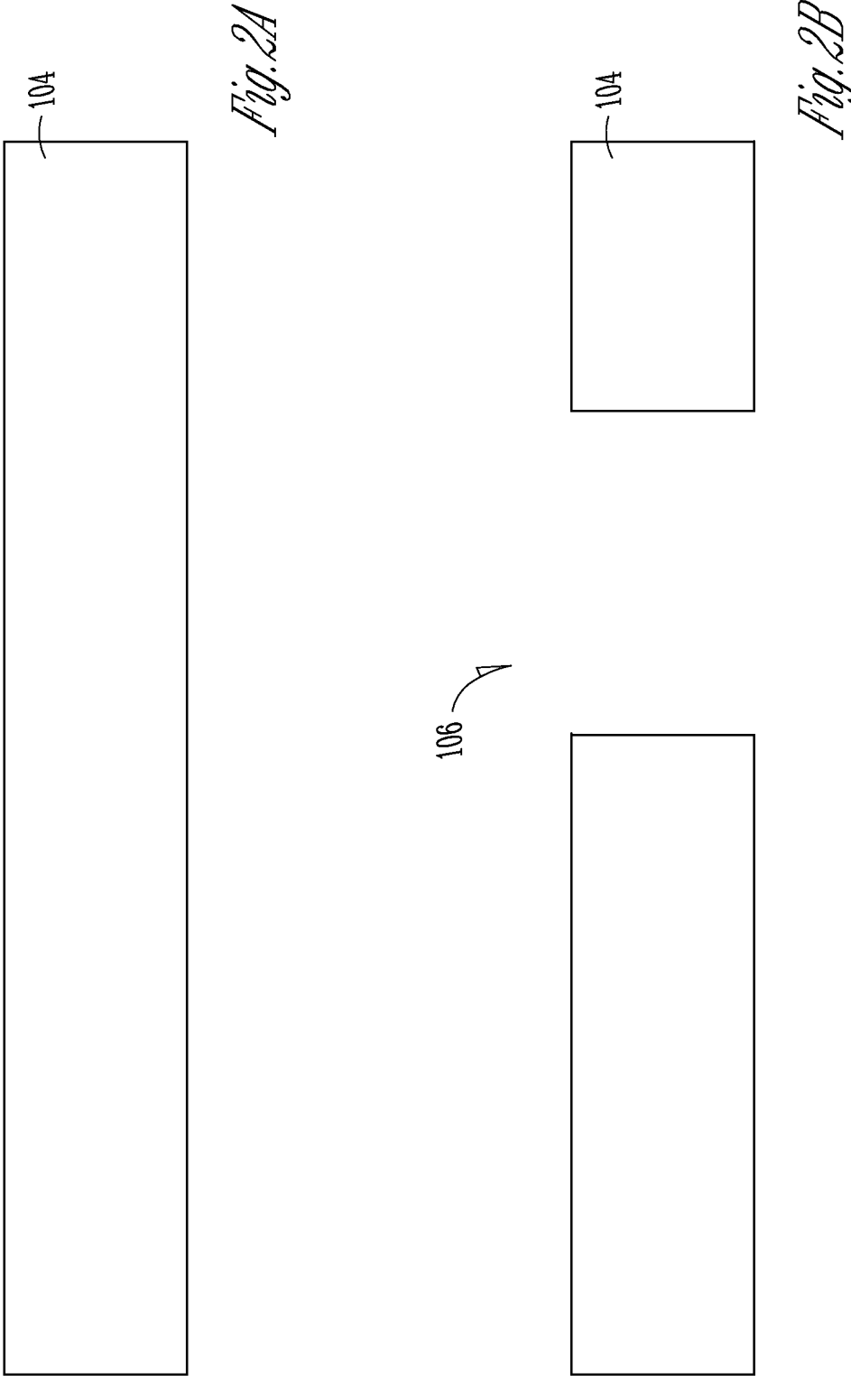

FIGS. 2A-2H illustrate a flow diagram of an example of a method of manufacture of making a substrate for an electronic system, such as the substrate 102 of FIG. 1. FIG. 2A is a side view of a glass core layer 104. In FIG. 2B, a cavity 106 is formed in the glass core layer 104. The cavity 106 may extend all the way through the glass core layer 104 as shown in FIG. 2B (through glass core), or the cavity 106 may extend only part way through the glass core layer 104 (embedded glass core). The cavity 106 may be formed by drilling (e.g., laser drilling), and in some examples the cavity 106 is formed by drilling and a wet etching process.

Figures 2C, 2D:
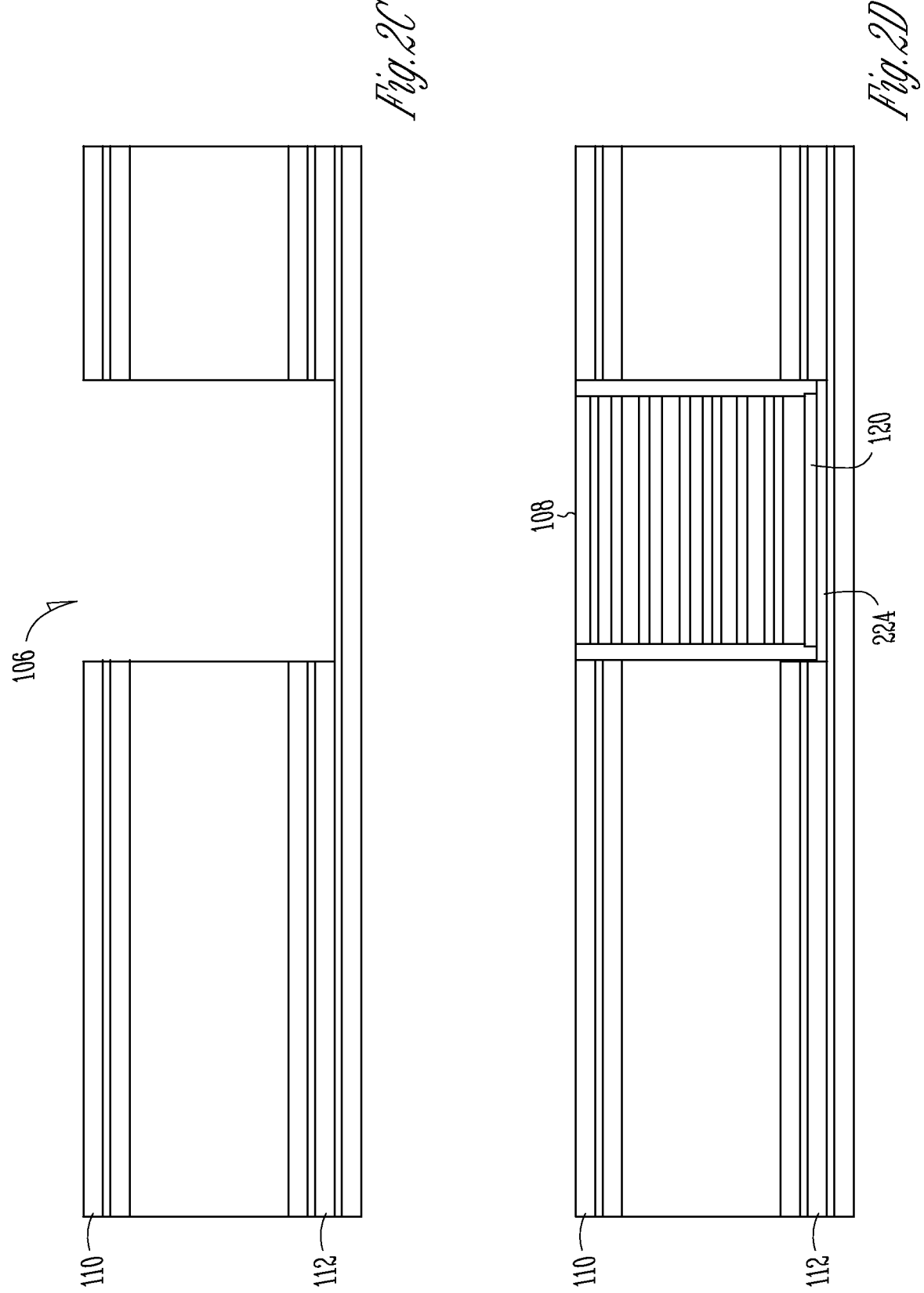

In FIG. 2C, buildup layers are formed on the glass core layer 104 including one or more top buildup layers 110 on the top surface of the glass core layer 104 and one or more bottom buildup layers 112 on the bottom surface of the glass core layer 104. In the example of FIG. 2C, the cavity 106 extends all the way through the top buildup layer 110 and extends through only a portion of the bottom buildup layer 112. In variations, the cavity 106 can extend all the way through the bottom buildup layer 112, or the cavity 106 may only be within the glass core layer 104 and stop at a top surface of the bottom buildup layer 112.

In FIG. 2D, active component dies 108 are disposed in the cavity 106. In the example of FIG. 2D, a stack of memory die is disposed in the cavity and the stack of memory die extends through the glass core layer 104 and to the top surface of the top buildup layer 110. An adhesive 224 can be used to attach the active component die 108 to the bottom buildup layer 112. A solderable metallization layer 120 can be added to the cavity before the active component die 108 or dies are placed in the cavity, or the solderable metallization layer 120 can be added to the bottom surface of the active component die 108 or dies.

Figure 2E:
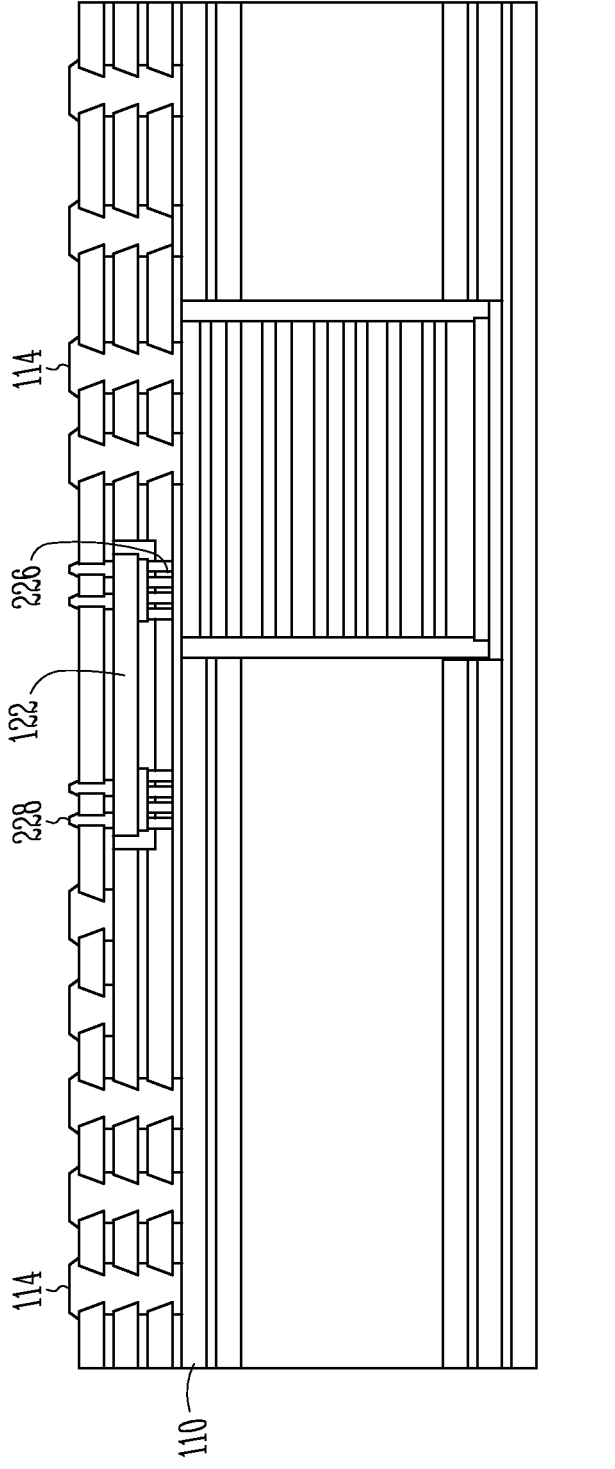

FIG. 2E shows more buildup layer patterning added to the top buildup layer 110 that includes electrically conductive interconnect, such as vias 114 and conductive traces. The electrically conductive interconnect contacts the top surface of the active component die 108 or dies and extends to the top surface of the top buildup layer 110 and the substrate.

The example of FIG. 2E shows that the electrically conductive interconnect can include a MIB 122 disposed in the top buildup layer 110. The bottom side of the MIB 122 is connected (e.g., by vias 226) to an I/O pad on the top surface of the active component die 108 or dies. The top side of the MIB 122 can be connected to vias 228 that extend to the top surface of the substrate. It can be seen in FIG. 2E that the MIB 122 and vias 226, 228, can have a finer pitch than the other electrically conductive interconnect (e.g., vias 114). Vias 226, 228 can be connected to another active component that may match the pitch of vias 228.

Figure 2F:
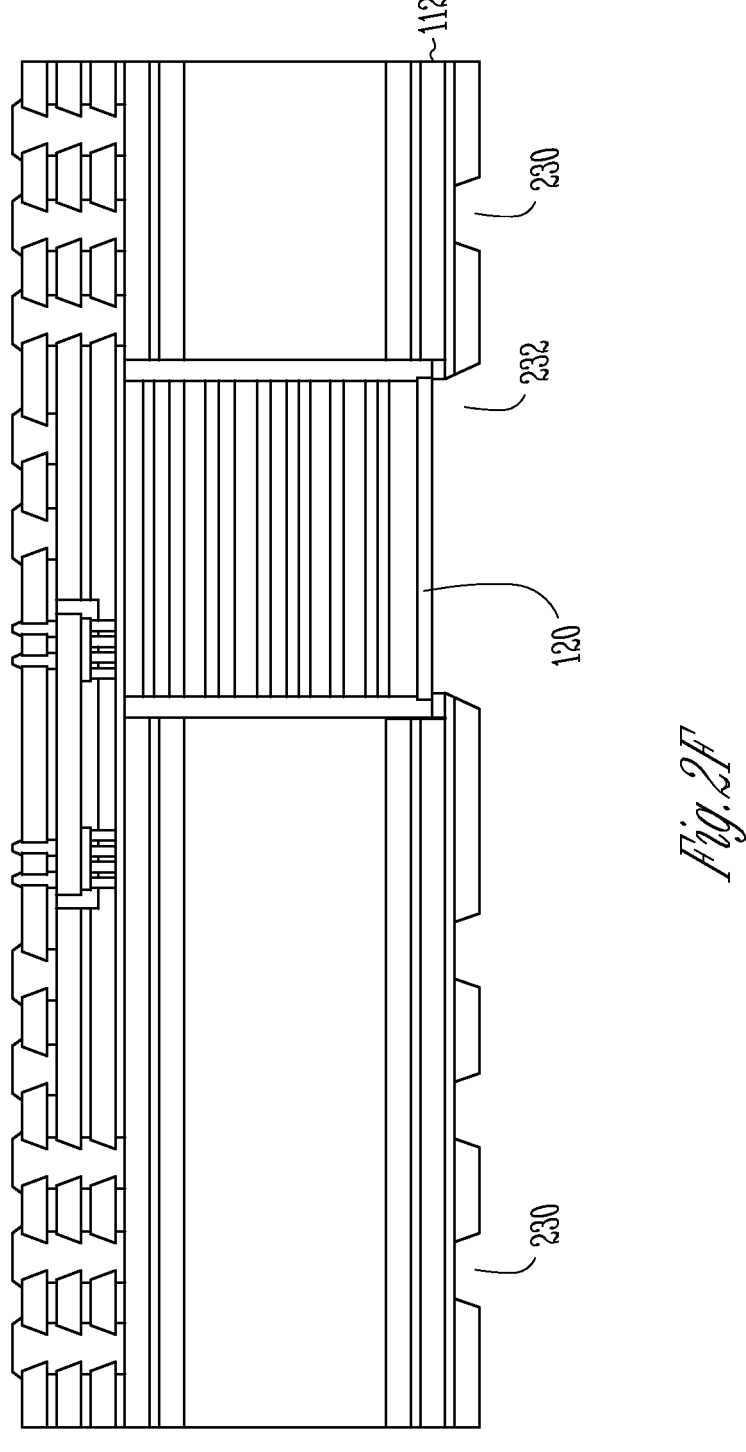
Figure 2G:
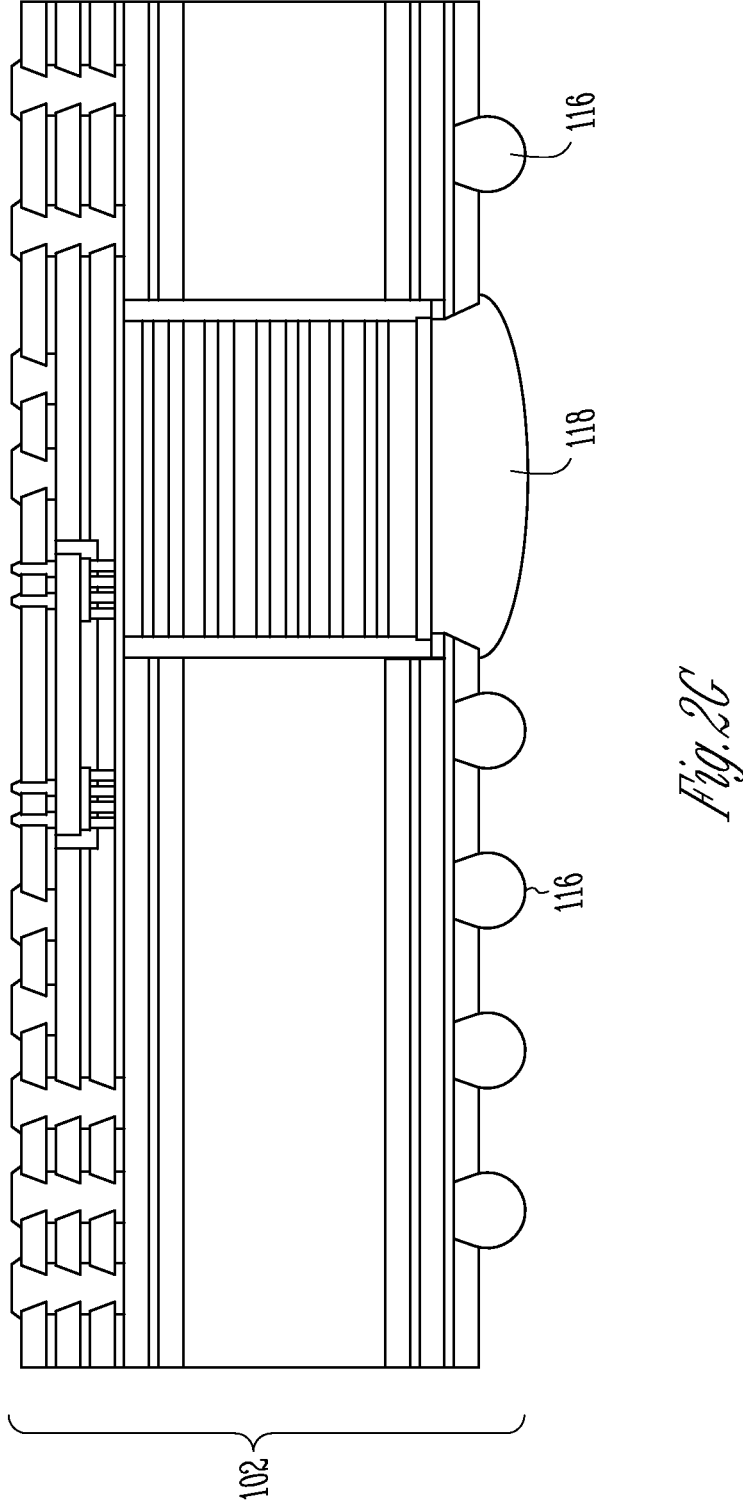
Figure 24:
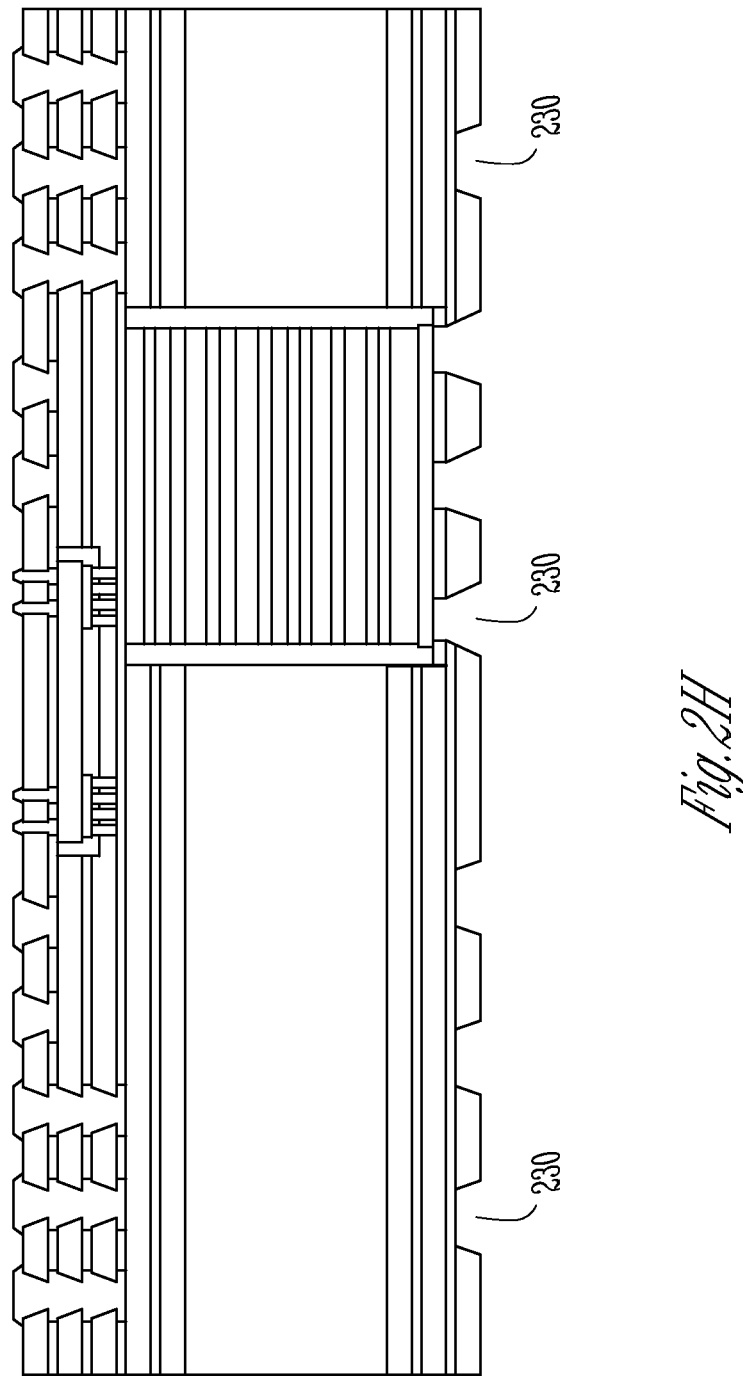

In FIG. 2F, openings are formed in the bottom buildup layer 112, and solder is to be added to the openings. The smaller openings 230 extend to the electrically conductive interconnect and are for signal-carrying solder bumps. The larger opening 232 extends to the solderable metallization layer 120 or the bottom surface of an active component die 108. The larger opening 232 is for a larger solder bump formation for carrying thermals away from the active component die 108. In FIG. 2G, signal-carrying solder bumps 116 are formed in the smaller openings 230 a larger thermal-carrying solder bump 118 is formed in the larger opening 232.

FIG. 2H shows an alternative where smaller openings 230 are formed beneath the active component die 108. The openings can be used for power connections to the active component die 108.

Figure 3:
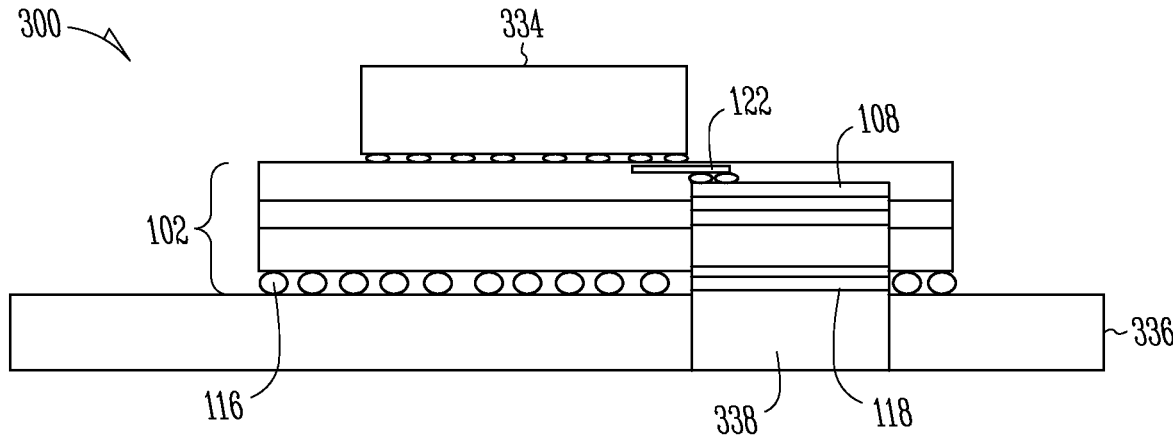
FIG. 3 and FIG. 4 are illustrations of cross section side views of examples of electronic systems in accordance with some embodiments.

FIG. 3 is a side view of an electronic system 300 that includes a substrate 102 such as the substrate of FIG. 1. Another active component 334 is attached to the top surface of the substrate 102. In an example intended to be nonlimiting, the active component 334 on the top surface of the substrate 102 is a compute component die (e.g., a central processing unit (CPU), graphics processing unit (GPU), or other processing unit (XPU)). The active component die 108 or dies disposed in the cavity of the substrate include multiple memory dies arranged in the cavity of the substrate 102 as a stack of memory dies. The bottom side of the active component 334 is electrically connected to the topside of a MIB 122. The bottom side of the MIB 122 is connected to the topside of the active component die 108 or dies in the cavity of the substrate 102.

The substrate 102 is attached to a motherboard 336 using BGA solder bumps 116 for a BGA socket. The substrate 102 includes thermal carrying solder bump 118 contacting a metal cooling structure of the motherboard (e.g., copper slug 338) under the socket to help cool the electronic system 300.

Figure 4:
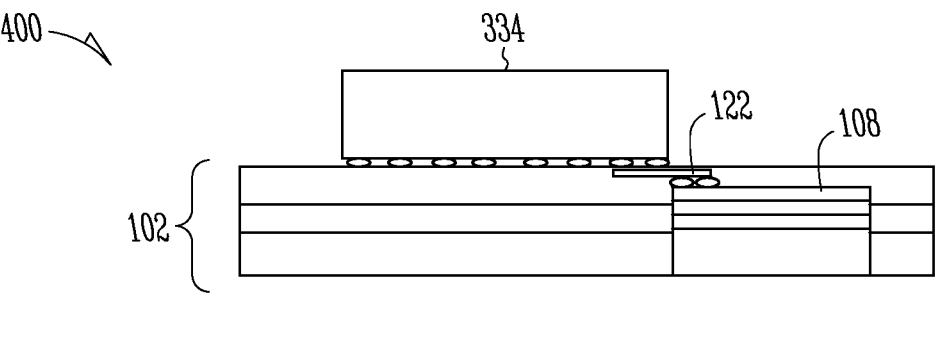

FIG. 4 is a is a side view of an electronic system 400 that includes a substrate 102 such as the substrate of FIG. 1. The substrate 102 includes Land Grid Array (LGA) pins to connect to the active component die 108 or dies in a LGA socket to cool the system through the active component die 108 or dies.

Placing an active component die in a cavity of the glass core layer 104 also provides the advantage of resolving mismatches in height among active dies of an electronic system. For example, if the compute component die has a different height than the memory component die, placing both of the dies on the top surface of the substrate results in a system with varying die height. This mismatch in die height can make thermal management in the system challenging as it complicates the design of thermal management structures (e.g., heat sinks) that contact the top of the dies.

Figure 5:
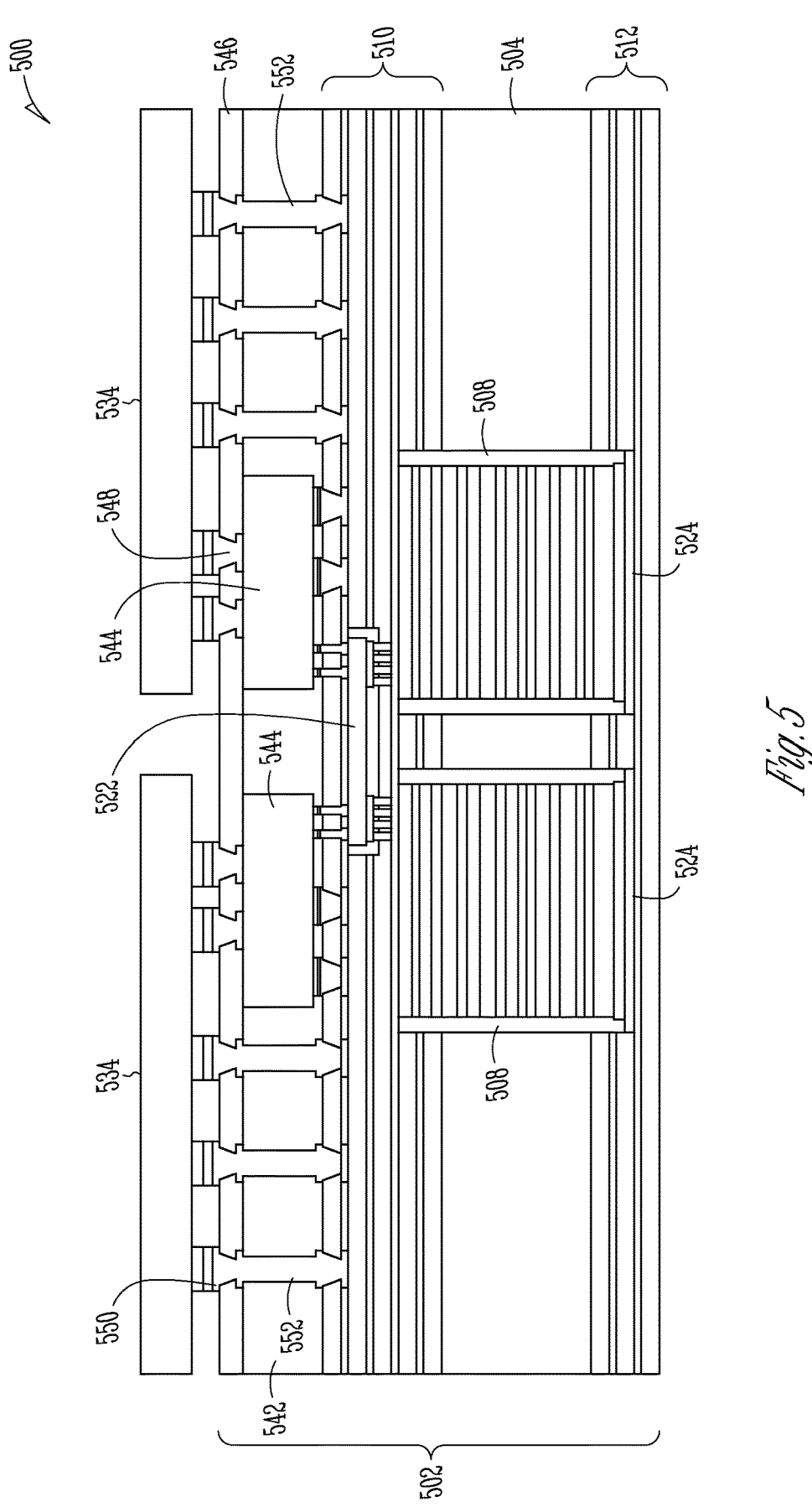
FIG. 5 is an illustration of a cross section side view of an example of an electronic system in accordance with some embodiments.

FIG. 5 is an illustration of a cross section side view of another example of an electronic system 500 that includes a substrate 502 and active component dies 534 on the top surface of the substrate 502. The top surface active component dies 534 can be compute component dies. The substrate 502 includes a glass core layer 504. The glass core layer 504 includes multiple cavities and an active component die 508 is disposed in the cavities of the glass core layer 504. The glass core layer active component dies 508 can be HBM components. In the example of FIG. 5, the HBM components include multiple memory dies (e.g., eight memory dies) arranged in a stack of memory dies.

Figure 6:
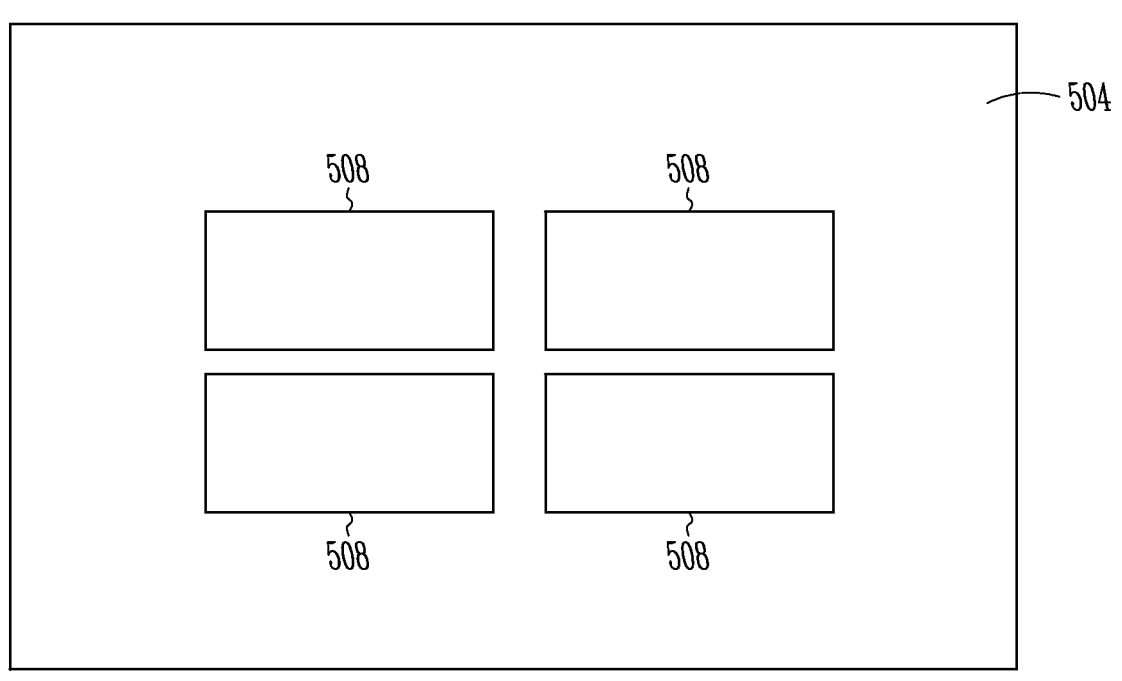
FIGS. 6-9 are illustrations of top views of the glass core layer, component dies, and multi-die interconnect bridge of FIG. 5 in accordance with some embodiments.

FIG. 6 is a top view of the glass core layer 504 and the multiple glass core layer active component dies 508. The example shown includes four cavities in the glass core layer 504 and a glass core layer active component die 508 in each of the cavities. Four cavities are shown for simplicity of the diagram. An actual implementation may include many cavities (e.g., dozens of cavities).

Returning to FIG. 5, the substrate 502 includes a top buildup layer 510 contacting the top surface of the glass core layer 504. The top buildup layer 510 can be a redistribution layer (RDL) that includes electrically conductive interconnect in a dielectric material. The substrate 502 also includes a bottom buildup layer 512. In the example of FIG. 5, the cavities in the glass core layer 504 are extended into the bottom buildup layer 512. The stack of memory dies extends outside the glass core layer 504 into the bottom buildup layer 512 and the top buildup layer 510. An adhesive 524 may be included in the bottom of the cavities. In some examples, the glass core layer active component dies 508 are within the glass core layer 504 and the adhesive 524 can be placed on the surface of the bottom buildup layer 512.

The substrate 502 includes a mold layer 542 contacting the top surface of the top buildup layer 510. The mold layer 542 includes at least one mold layer active component die 544 disposed in the mold layer 542. In the example of FIG. 5, the mold layer active component dies 544 are I/O component dies encapsulated in the mold layer 542. The I/O component dies can provide I/O for the system 500. In some examples the I/O component dies can include a memory controller to manage I/O between the compute component dies and memory dies.

The substrate 502 includes a MIB 522 that can electrically connect the glass core layer active component dies 508 together, the mold layer active component dies 544 together, and the glass core layer active component dies 508 and the mold layer active component dies 544 together.

Figure 7:
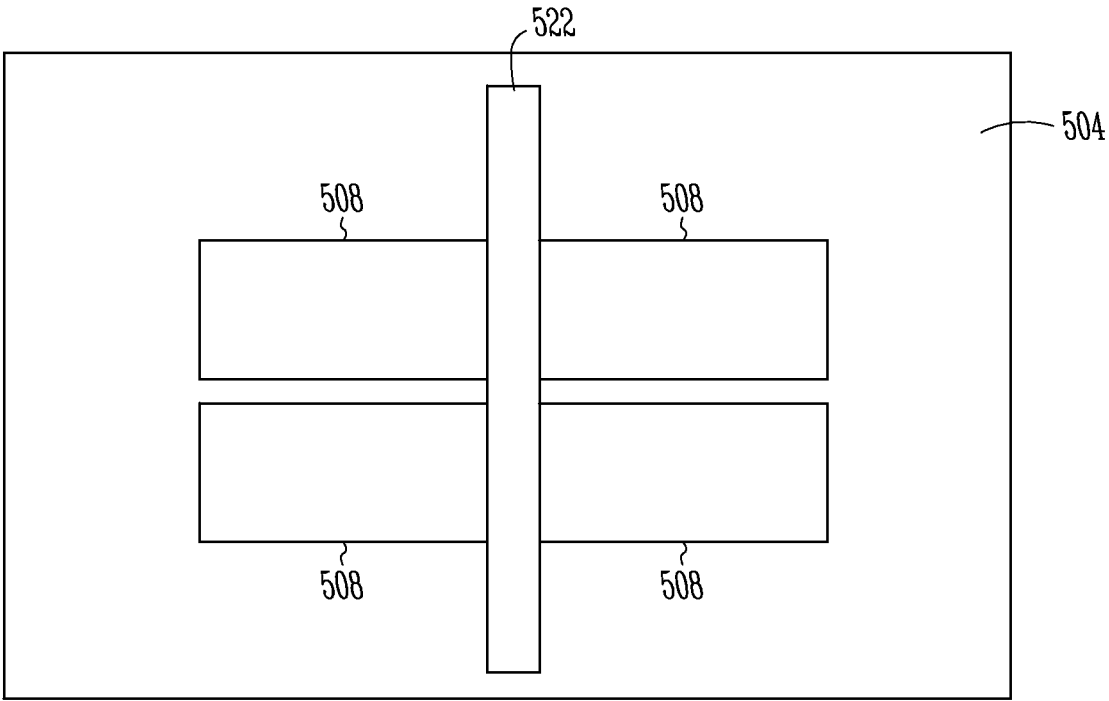

FIG. 7 is a top view of the glass core layer 504, the multiple glass core layer active component dies 508, and the MIB 522 above the glass core layer 504. The glass core layer 504 includes four cavities and a glass core layer active component die 508 in each of the cavities. The MIB 522 can provide interconnect for the four glass core layer active component dies 508.

Figure 8:
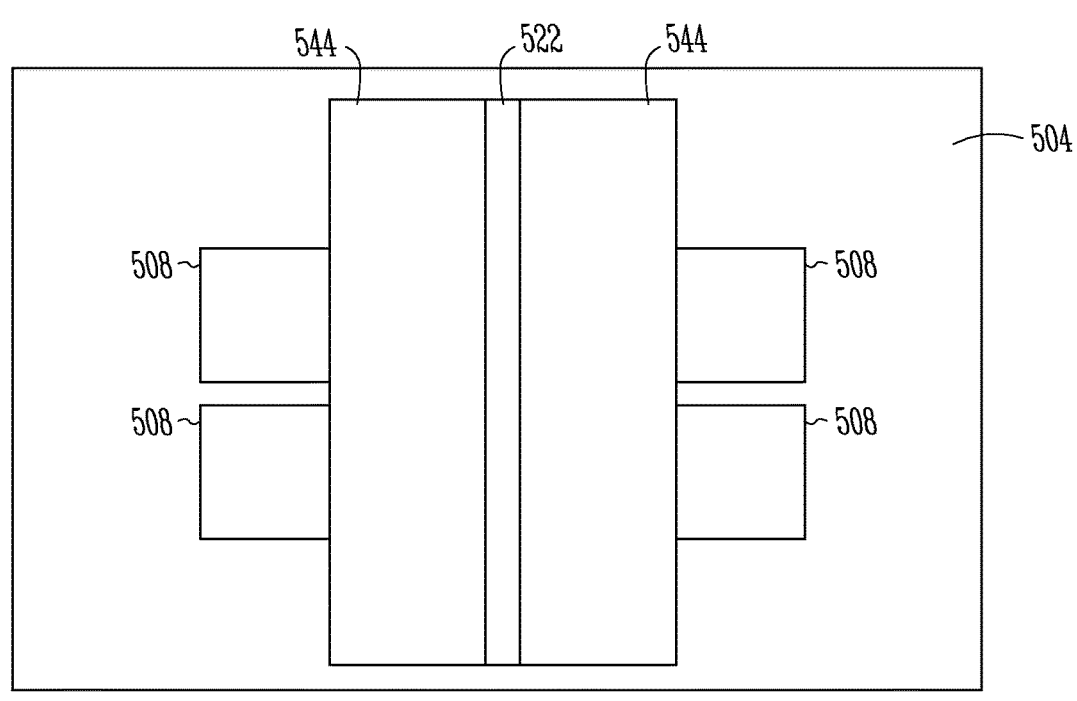

FIG. 8 is a top view of the glass core layer 504, the four glass core layer active component dies 508, the MIB 522, and two mold layer active component dies 544 above the MIB 522. The MIB 522 can provide interconnection for the glass core layer active component dies 508 and mold layer active component dies 544.

Returning to FIG. 5, the substrate 502 can include a third buildup layer 546 contacting the top surface of the mold layer 542. The third buildup layer 546 can be a second RDL and can include electrically conductive interconnect including vias 548. The top surface of the third buildup layer 546 can be the top surface of the substrate 502 and include bonding pads 550. The top surface active component dies 534 can be attached to the bonding pads 550. The substrate 502 can include one or more copper pillars 552 that extend from the first buildup layer 510 through the mold layer 542 and third build up layer 546 to the top surface of the substrate 502. The top surface active component dies 534 can be electrically connected to the one or more copper pillars 552, and the first buildup layer 510 can electrically connect the copper pillars 552 to the glass core layer active component dies 508.

Figure 9:
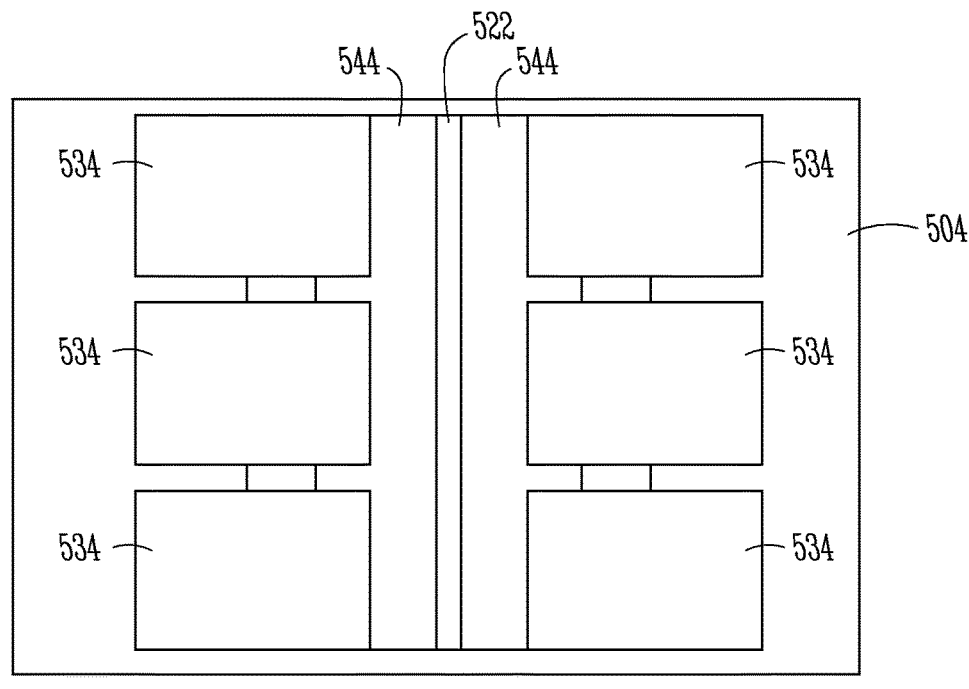

FIG. 9 is a top view of the glass core layer 504, the MIB 522, the two mold layer active component dies 544 above the MIB 522, and six top surface active component dies 534 on the top surface of the substrate. The glass core layer active component dies 508 can be HBM dies, the six top surface active component dies 534 can be compute component dies, and the mold layer dies can be I/O component dies to support I/O of one or both of the compute component dies and the HBM dies.

In a conventional approach, all the dies are attached on a top surface of a substrate. This can cause a challenge to thermal management when the different types of dies have different heights. The three-dimensional arrangement of dies and interconnect eliminates height mismatch. The mold layer 542 has a uniform height. This eliminates any mismatch in height in the higher layers above the mold layer 542. Also, the three-dimensional arrangement can result in fewer MIBs needed due to the ability to provide both top and bottom connections to the MIB 522. As shown in examples of FIGS. 7 and 8, four HBM components and two I/O component dies can be attached in a three-dimensional arrangement using one MIB.

Figures 10A, 10B, 10C, 10D, 10E:
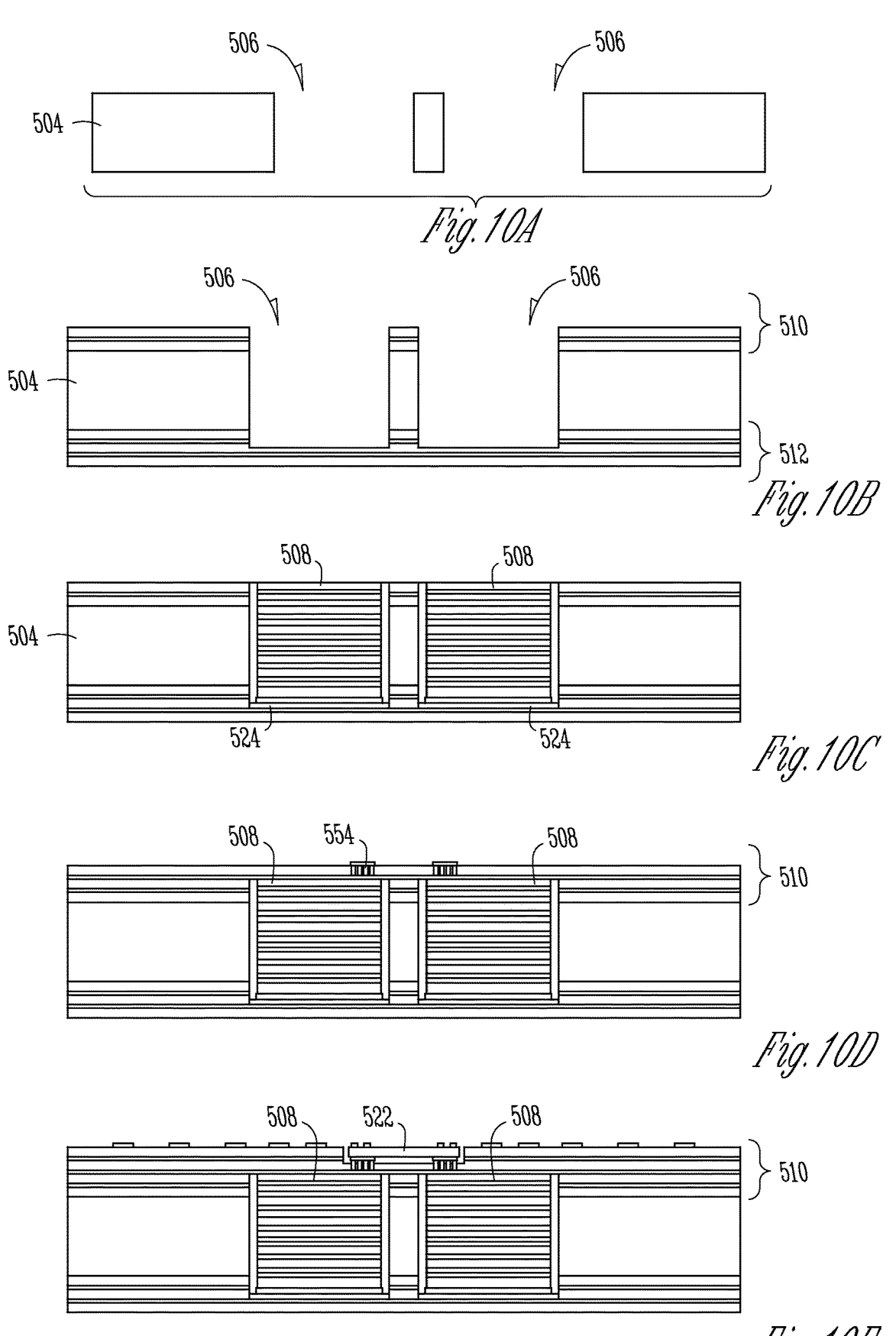
FIGS. 10A-10H illustrate a flow diagram of another example of a method of manufacture of a substrate for an electronic system in accordance with some embodiments.

FIGS. 10A-10H illustrate a flow diagram of an example of a method of manufacture of a substrate for an electronic system, such as the substrate 502 of FIG. 5. FIG. 10A is a side view of a glass core layer 504 of the substrate 502 of the electronic system. One or more cavities 506 are formed in the glass core layer 504, such as by laser drilling and a wet etch process.

In FIG. 10B, buildup layer patterning of dielectric material and electrically conductive interconnect is formed on the top and bottom surfaces of the glass core layer 504 for the top buildup layer 510 and the bottom buildup layer 512. The height of the buildup layer patterning depends on the size of the component to be placed in the cavities. In the example of FIG. 10B, the cavity 506 is extended into the bottom buildup layer 512 and to the top of the top buildup layer 510. In some examples, the cavity 506 is only within the glass core layer.

In FIG. 10C, adhesive 524 is added to the bottom of the cavity 506 and a glass core layer active component die 508 is disposed in each of the cavities 506 in the glass core layer 504. In FIG. 10D, the buildup patterning of dielectric material and electrically conductive interconnect 554 is continued on the top buildup layer 510.

Figure 10F:
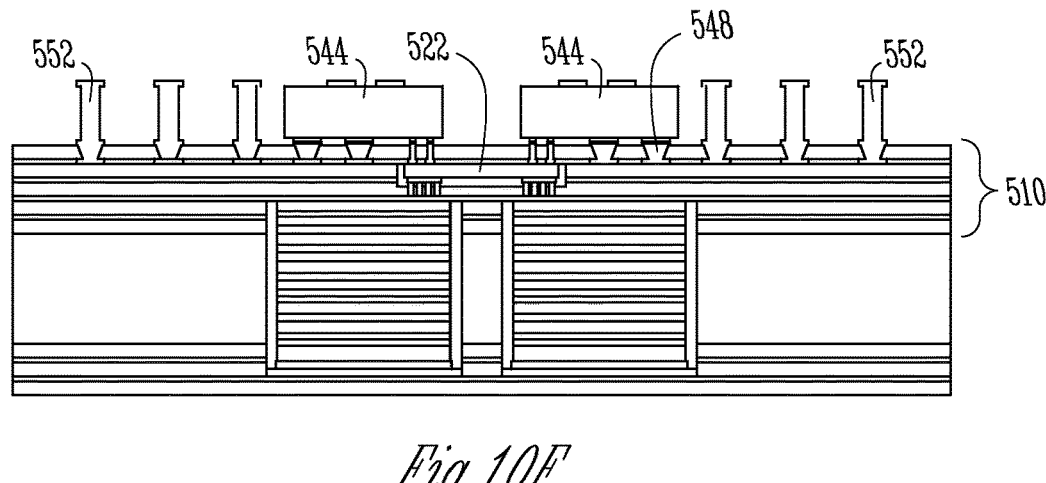

In FIG. 10E, a MIB 522 is disposed in the first buildup layer 510. The MIB 522 is electrically connected to the glass core layer active component dies 508. In FIG. 10F, vias 548 are formed in the top buildup layer 510 and copper pillars 552 are formed on the top buildup layer 510. Mold layer active component dies 544 are disposed on the top buildup layer 510. The glass core layer active component dies 508 are connected to the mold layer active component dies 544 using the MIB 522.

Figure 10G:
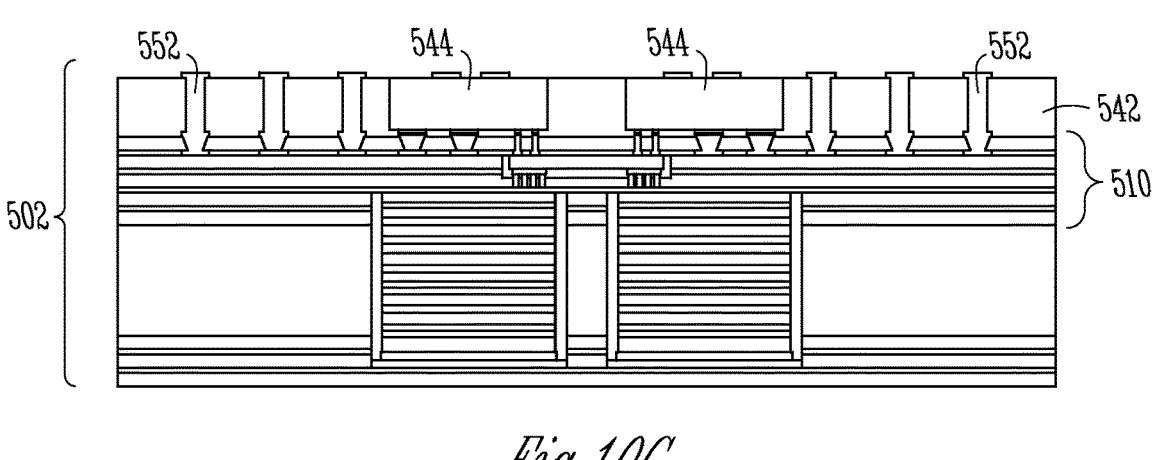
Figure 10H:
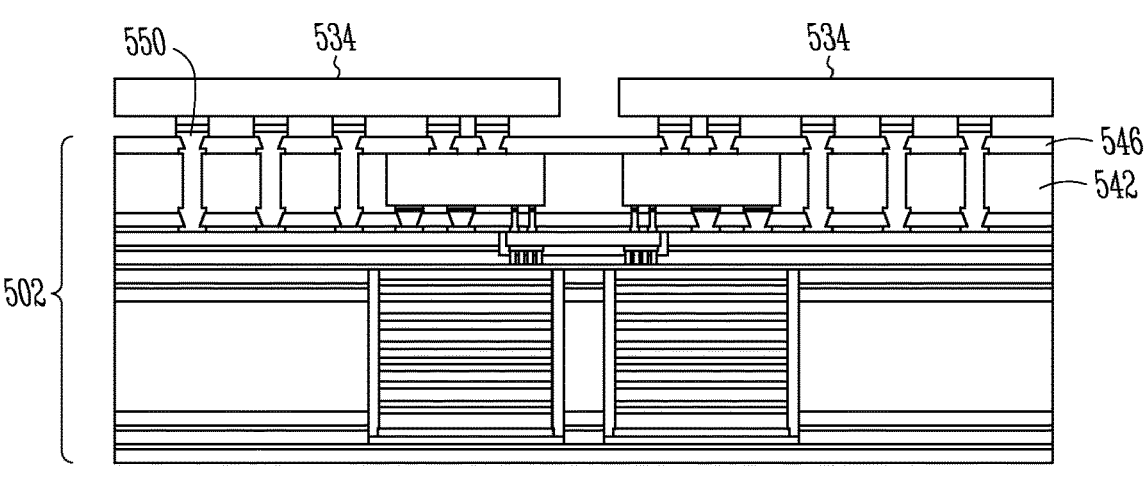

In FIG. 10G, a mold layer 542 is formed by disposing a mold material on the top buildup layer 510 to encapsulate the mold layer active component dies 544 and the copper pillars 552. In FIG. 10H, the third buildup layer 546 is formed on the top surface of the mold layer 542. The third buildup layer 546 includes electrically conductive interconnect that includes die bonding pads 550 on the top surface.

The top surface active component dies 534 are attached to the bonding pads 550 on the top surface of the third buildup layer 546.

Figure 11:
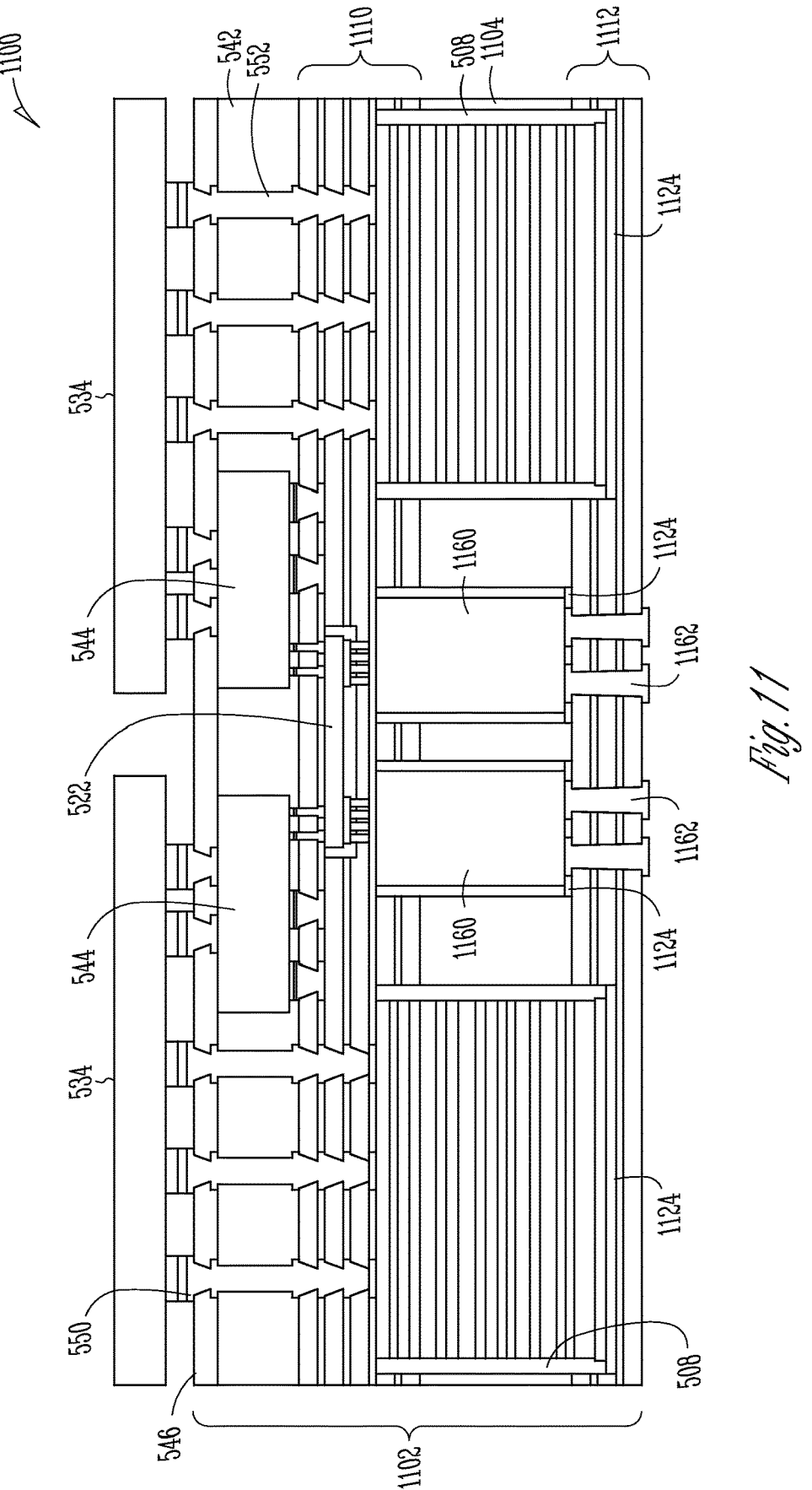
FIG. 11 is an illustration of a cross section side view of another example of an electronic system in accordance with some embodiments.

FIG. 11 is another illustration of a cross section side view of an example of an electronic system 1100 that includes a substrate 1102 and active component dies 534 (e.g., compute component dies) on the top surface of the substrate 1102. The substrate 1102 includes a glass core layer 1104. The glass core layer 1104 includes multiple cavities. The cavities can be two different sizes. An active component dies 508 can be disposed in the larger cavities of the glass core layer 1104, and a discrete passive component 1160 can be disposed in the smaller cavities of the glass core layer 1104. The glass core layer active component dies 508 can be HBM components that can be comprised of multiple individual memory dies. The discrete passive components 1160 include only passive electronic components such as discrete inductors, discrete capacitors, discrete resistors, or combinations thereof, and do not include active components.

Figure 12:
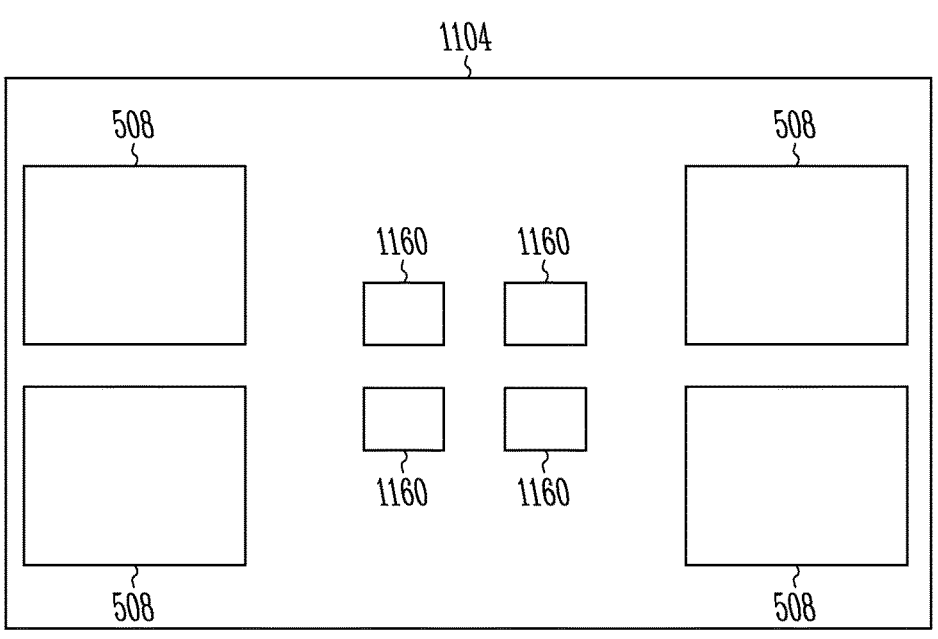
FIGS. 12-15 are illustrations of top views of the glass core layer, component dies, discrete passive components, and multi-die interconnect bridge of FIG. 11 in accordance with some embodiments.

FIG. 12 is a top view of the glass core layer 104, multiple glass core layer active component dies 508, and multiple discrete passive components 1160. The example shown includes four glass core layer active component dies 508 disposed in four larger cavities of the glass core layer 1104, and four discrete passive components 1160 disposed in four smaller cavities. An actual implementation may include many of the larger and smaller cavities.

Returning to FIG. 11, the substrate 1102 includes a mold layer 542 and a top buildup layer 1110 between the top surface of the glass core layer 1104 and the bottom surface of the mold layer 542. The top buildup layer 1110 can be a redistribution layer (RDL) that includes electrically conductive interconnect in a dielectric material. The electrically conductive interconnect of the top buildup layer connects the glass core layer active component dies 508, the discrete passive components 1160, and the mold layer active component dies 544.

The substrate 1102 also includes a bottom buildup layer 1112 contacting the bottom surface of the glass core layer 1104. In the example of FIG. 11, the larger cavities in the glass core layer 1104 are extended into the bottom buildup layer 1112. The stack of memory dies extends higher and lower than the glass core layer 1104 into the bottom buildup layer 1112 and the top buildup layer 1110. An adhesive 1124 may be included in the bottom of the cavities in the bottom buildup layer 1112. The smaller cavities in the glass core layer 1104 stop at the top surface of the bottom buildup layer 1112. The adhesive 1124 can be placed on the top surface of the bottom buildup layer 1112 to hold the discrete passive components 1160. The top of the discrete passive components 1160 may extend into the top buildup layer 1110. The bottom buildup layer 1112 can include vias 1162 from the discrete passive components 1160 to the back surface of the substrate 1102. The vias 1162 allow power connections to the backside of the substrate 1102.

The mold layer 542 includes mold layer active component dies 544 (e.g., I/O component dies) disposed in the mold layer 542. The substrate 1102 includes a MIB 1122 embedded in the top buildup layer 510. The MIB 1122 can electrically connect the discrete passive components 1160 together, the mold layer active component dies 544 together, and the discrete passive components 1160 and the mold layer active component dies 544 together.

Figure 13:
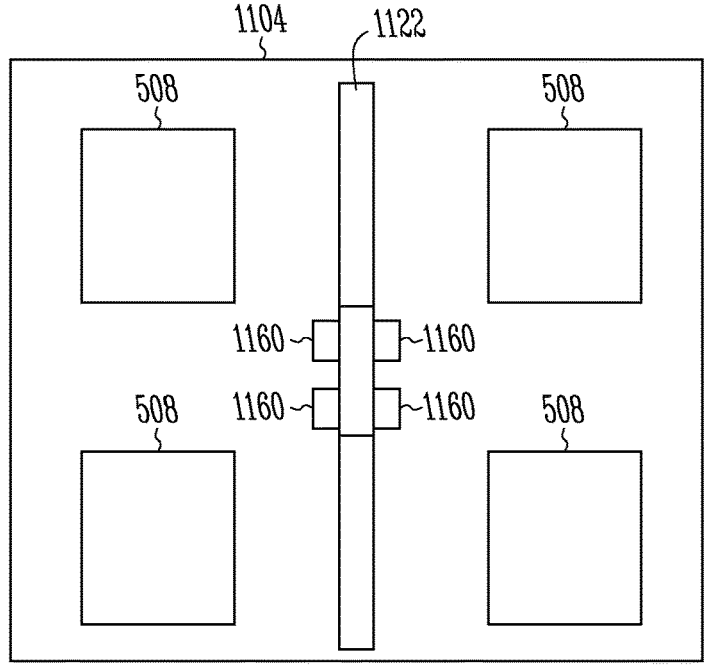
Figure 14:
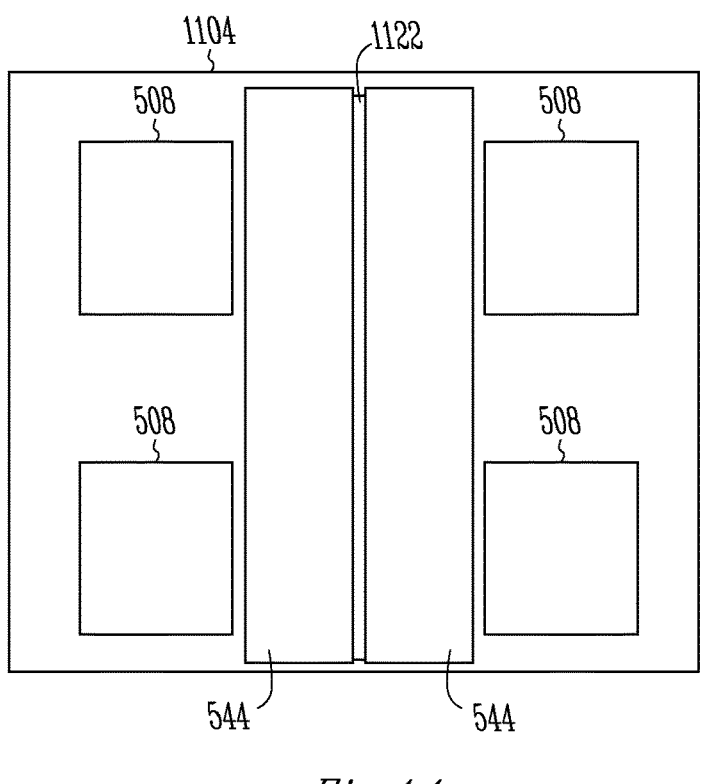

FIG. 13 is a top view of the glass core layer 1104, four glass core layer active component dies 508, and four discrete passive components 1160 in cavities of the glass core layer 1104. FIG. 13 also shows the MIB 1122 above the glass core layer 1104. The MIB 522 can be electrically connected to the four discrete passive components 1160. FIG. 14 is a top view of the glass core layer 1104, the four glass core layer active component dies 508, the MIB 1122, and two mold layer active component dies 544 above the MIB 122. The MIB 522 can provide interconnection for the four discrete passive components 1160 and mold layer active component dies 544.

Returning to FIG. 11, the substrate 1102 can include a third buildup layer 546 contacting the top surface of the mold layer 542. The third buildup layer 546 can be a second RDL and can include electrically conductive interconnect including vias 548. The top surface active component dies 534 can be attached to bonding pads 550 of the third buildup layer 546. The substrate 502 can include one or more copper pillars 552 that extend from the top buildup layer 510 through the mold layer 542 and third build up layer 546 to the top surface of the substrate 502. The top surface active component dies 534 can be electrically connected to the one or more copper pillars 552, and the first buildup layer 510 can electrically connect the copper pillars 552 to the glass core layer active component dies 508.

Figure 15:
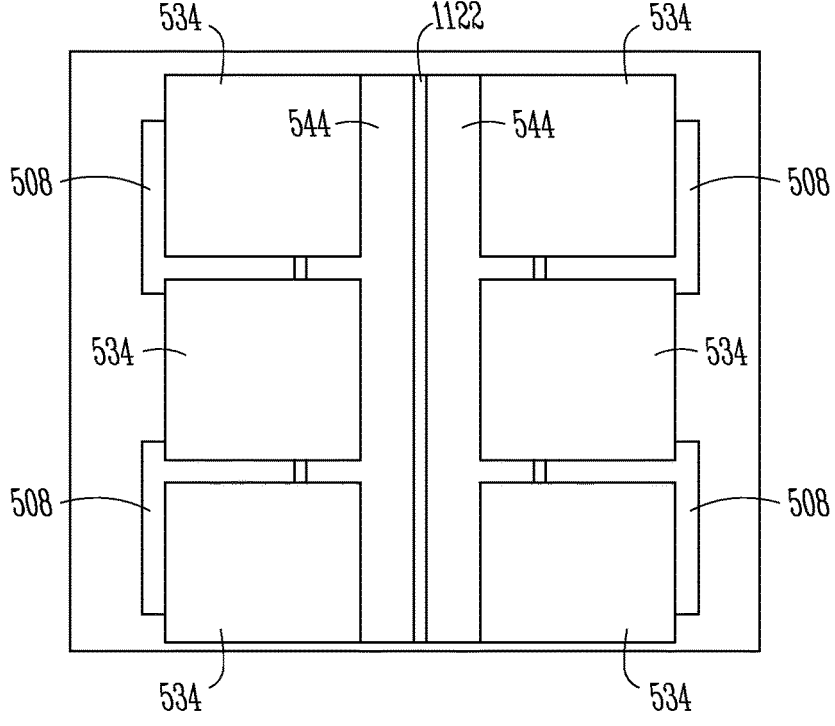

FIG. 15 is a top view of the glass core layer 1104, the MIB 122, the four glass core layer active component dies 508, the two mold layer active component dies 544 above the MIB 1122, and six top surface active component dies 534 on the top surface of the substrate 1102. The glass core layer active component dies 508 can be HBM dies, the discrete passive components can be discrete inductors, and the six top surface active component dies 534 can be compute component dies, and the mold layer dies can be I/O component dies to support I/O of one or both of the compute component dies and the HBM dies. In a conventional approach, all the memory dies, compute dies, I/O dies, and discrete inductors are mounted on a top surface of a substrate. Because the different types of components may have different heights, the three-dimensional arrangement of components and interconnect in the examples of FIGS. 11-15 eliminates height mismatch. Also, the MIB 1122 can provide both top and bottom connections to the components for a tree dimensional connection.

Figures 16A, 16B, 16C, 16D, 16E:
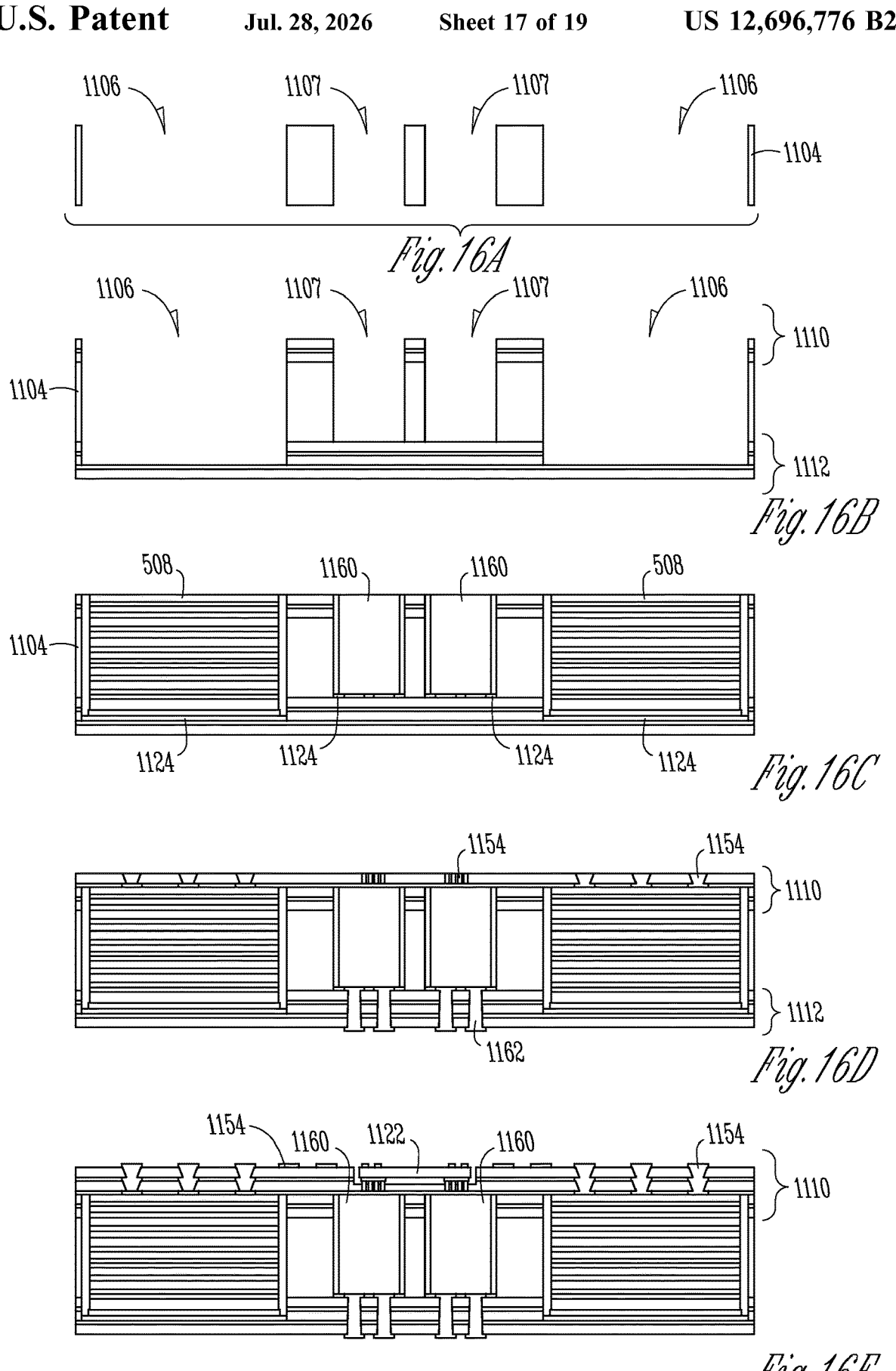
FIGS. 16A-16H illustrate a flow diagram of another example of a method of manufacture of a substrate for an electronic system in accordance with some embodiments.

FIGS. 16A-16H illustrate a flow diagram of an example of a method of manufacture of a substrate for an electronic system, such as the substrate 1102 of FIG. 11. FIG. 16A is a side view of a glass core layer 1104 of the substrate 502 of the electronic system. Multiple cavities 1106, 1107 are formed in the glass core layer 1104. The cavities can be formed in the glass core layer 1104 using a laser and wet etch process. The example of FIG. 16A shows four cavities for simplicity of the drawings. The outer two cavities 1106 have a larger diameter than the two inner cavities 1107.

In FIG. 16B, buildup layer patterning of dielectric material and electrically conductive interconnect is formed on the top and bottom surfaces of the glass core layer 1104 for the top buildup layer 1110 and the bottom buildup layer 1112. The height of the buildup layer patterning depends on the size of the components to be placed in the cavities. In the example of FIG. 11B, the large cavities 1106 extend into the bottom buildup layer 512 and to the top of the top buildup layer 1110. In some examples, the larger cavities 1106 are only within the glass core layer 1104. The smaller cavities 1107 extend from the top surface of the bottom buildup layer 1112 to the top surface of the top buildup layer 1110. In some examples, the smaller cavities 1107 are only within the glass core layer 1104.

In FIG. 16C, adhesive 1124 is added to the bottom of the cavities. A glass core layer active component die 508 is disposed in each of the larger cavities, and a discrete passive component 1160 is disposed in each of the smaller cavities in the glass core layer 1104. In FIG. 16D, the buildup layer patterning of dielectric material and electrically conductive interconnect 1154 is continued on the top buildup layer 1110 and the bottom buildup layer 1112. The electrically conductive interconnect of the bottom buildup layer 1112 includes vias 1162.

Figure 16F:
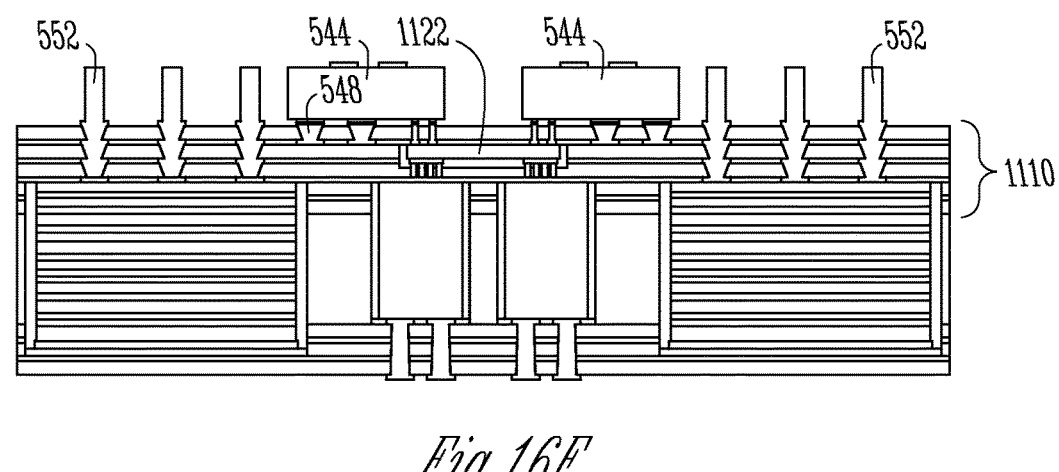

In FIG. 16E, the patterning of electrically conductive interconnect 1154 is continued. A MIB 1122 is disposed in the first buildup layer 1110. The MIB 1122 is electrically connected to the discrete passive components 1160. In FIG. 16F, vias 548 are formed in the top buildup layer 510 and copper pillars 552 are formed on the top buildup layer 510. Mold layer active component die 544 are disposed on the top buildup layer 510. The discrete passive components 1160 are connected to the mold layer active component dies 544 using the MIB 1122.

Figure 16G:
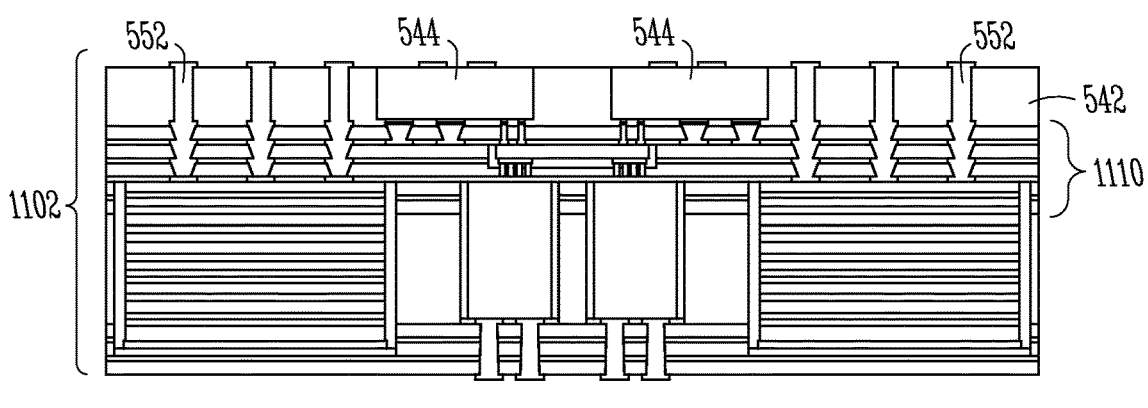
Figure 16H:
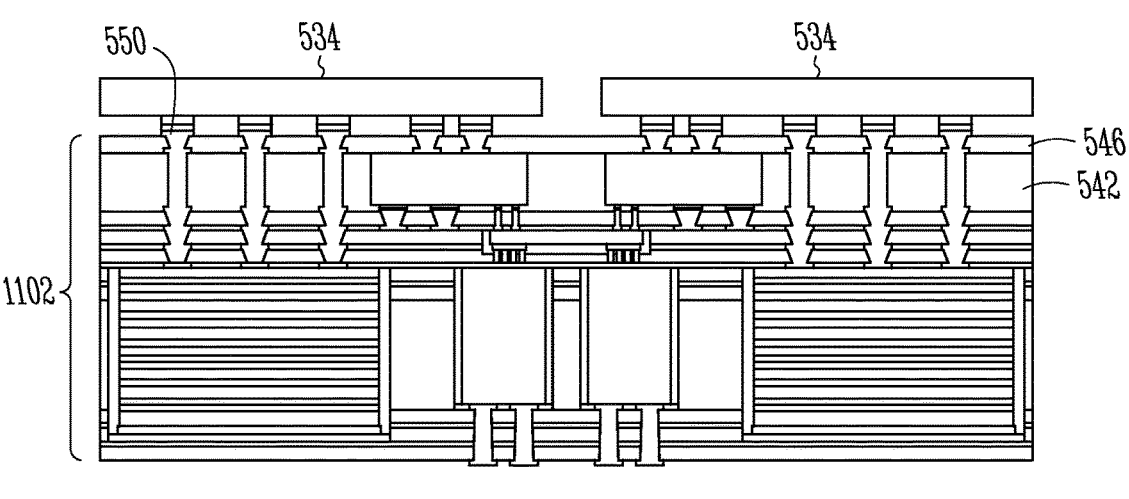

In FIG. 16G, a mold layer 542 is formed by disposing a mold material on the top buildup layer 510 to encapsulate the mold layer active component dies 544 and the copper pillars 552. In FIG. 16H, the third buildup layer 546 is formed on the top surface of the mold layer 542. The top surface active component dies 534 are attached to the die bonding pads 550 on the top surface of the substrate 1102.

The example devices of FIG. 11 and FIGS. 16A-16H provide a central I/O architecture with embedded discrete components in the glass core. Embedding discrete inductors provides high magnetic permeability inductors for circuits that provide power to the electronic system. Capacitors can also be embedded in the glass core layer for the power circuits. The technique can provide a dual-sided embedded connection for the discrete inductors and/or capacitors.

Figure 17:
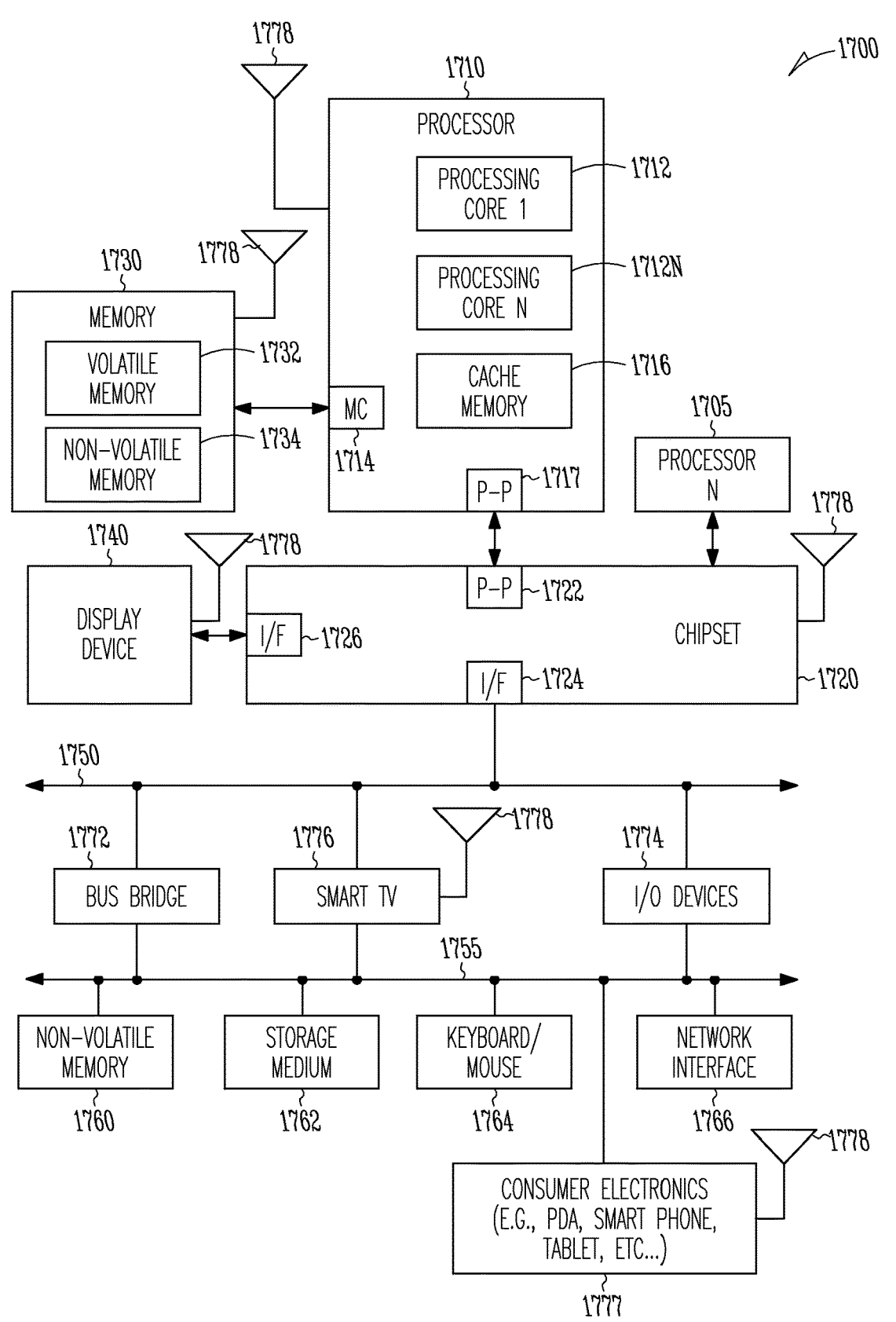
FIG. 17 illustrates a system level diagram in accordance with some embodiments.

FIG. 17 illustrates a system level diagram, according to one embodiment of the present disclosure. For instance, FIG. 17 depicts an example of a system that can include an electronic device packaged with a substrate having a glass core layer. The glass core layer can include active components embedded in the glass core layer and discrete passive components embedded in the glass core layer. In one embodiment, system 1700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance, or any other type of computing device. In some embodiments, system 1700 is a system on a chip (SOC) system. In one example, two or more systems as shown in FIG. 17 may be provided circuit power using components attached to a back side of a package substrate as described in the present disclosure.

In one embodiment, processor 1710 has one or more processing cores 1712 and 1712N, where N is a positive integer and 1712N represents the Nth processor core inside processor 1710. In one embodiment, system 1700 includes multiple processors including 1710 and 1705, where processor 1705 has logic similar or identical to the logic of processor 1710. In some embodiments, processing core 1712 includes, but is not limited to, pre-fetch logic to fetch instructions, decode logic to decode the instructions, execution logic to execute instructions and the like. In some embodiments, processor 1710 has a cache memory 1716 to cache instructions and/or data for system 1700. Cache memory 1716 may be organized into a hierarchal structure including one or more levels of cache memory.

In some embodiments, processor 1710 includes a memory controller 1714, which is operable to perform functions that enable the processor 1710 to access and communicate with memory 1730 that includes a volatile memory 1732 and/or a non-volatile memory 1734. In some embodiments, processor 1710 is coupled with memory 1730 and chipset 1720. Processor 1710 may also be coupled to a wireless antenna 1778 to communicate with any device configured to transmit and/or receive wireless signals. In one embodiment, the wireless antenna interface 1778 operates in accordance with, but is not limited to, the IEEE 802.11 standard and its related family, Home Plug AV (HPAV), Ultra-Wide Band (UWB), Bluetooth, WiMax, or any form of wireless communication protocol.

In some embodiments, volatile memory 1732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1734 includes, but is not limited to, flash memory, phase change memory (PCM), read-only memory (ROM), electrically erasable programmable read-only memory (EEPROM), or any other type of non-volatile memory device.

Memory 1730 stores information and instructions to be executed by processor 1710. In one embodiment, memory 1730 may also store temporary variables or other intermediate information while processor 1710 is executing instructions. In the illustrated embodiment, chipset 1720 connects with processor 1710 via Point-to-Point (PtP or P-P) interfaces 1717 and 1722. Chipset 1720 enables processor 1710 to connect to other elements in system 1700. In some embodiments, interfaces 1717 and 1722 operate in accordance with a PtP communication protocol such as the Intel® QuickPath Interconnect (QPI) or the like. In other embodiments, a different interconnect may be used.

In some embodiments, chipset 1720 is operable to communicate with processor 1710, 1705N, display device 1740, and other devices 1772, 1776, 1774, 1760, 1762, 1764, 1766, 1777, etc. Buses 1750 and 1755 may be interconnected together via a bus bridge 1772. Chipset 1720 connects to one or more buses 1750 and 1755 that interconnect various elements 1774, 1760, 1762, 1764, and 1766. Chipset 1720 may also be coupled to a wireless antenna 1778 to communicate with any device configured to transmit and/or receive wireless signals. Chipset 1720 connects to display device 1740 via interface (I/F) 1726. Display 1740 may be, for example, a touchscreen, a liquid crystal display (LCD), a plasma display, cathode ray tube (CRT) display, or any other form of visual display device. In some embodiments, processor 1710 and chipset 1720 are merged into a single SOC. In one embodiment, chipset 1720 couples with (e.g., via interface 1724) a non-volatile memory 1760, a mass storage medium 1762, a keyboard/mouse 1764, and a network interface 1766 via I/F 1724 and/or I/F 1726, I/O devices 1774, smart TV 1776, consumer electronics 1777 (e.g., PDA, Smart Phone, Tablet, etc.).

In one embodiment, mass storage medium 1762 includes, but is not limited to, a solid state drive, a hard disk drive, a universal serial bus flash memory drive, or any other form of computer data storage medium. In one embodiment, network interface 1766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMax, or any form of wireless communication protocol.

While the modules shown in FIG. 17 are depicted as separate blocks within the system 1700, the functions performed by some of these blocks may be integrated within a single semiconductor circuit or may be implemented using two or more separate integrated circuits. For example, although cache memory 1716 is depicted as a separate block within processor 1710, cache memory 1716 (or selected aspects of 1716) can be incorporated into processor core 1712.

The devices, systems, and methods described can provide improved routing of power and reduced size of a multichip package by providing high magnetic permeability components for the circuits that produce the power with the substrate.

To better illustrate the method and apparatuses disclosed herein, a non-limiting list of example embodiments is provided here:

Example 1 includes subject matter (such as an electronic system) comprising a glass core layer including multiple cavities formed through the glass core layer, at least one glass core layer active component die disposed in a cavity of the multiple cavities, at least one discrete passive component disposed in another cavity of the multiple cavities, a mold layer including at least one mold layer active component die disposed in the mold layer, and a first buildup layer contacting a top surface of the glass core layer and a bottom surface of the mold layer. The first buildup layer includes electrically conductive interconnect connecting the at least one glass core layer active component die, the at least one discrete passive component, and the at least one mold layer active component die. The system further includes at least one top surface active component die attached to the top surface of the substrate and electrically connected to the at least one mold layer active component die.

In Example 2, the subject matter of Example 1 optionally includes at least one glass core layer active component die including a high bandwidth memory (HBM) component, at least one discrete passive component including a discrete inductor, at least one mold layer active component die including an input/output (I/O) component die, and at least one top surface active component die including a compute component die.

In Example 3, the subject matter of one of both of Examples 1 and 2 optionally includes a second buildup layer contacting the bottom surface of the glass core layer, wherein the at least one glass core layer active component die extends outside the glass core layer into the second buildup layer the at least one discrete passive component contacts the top surface of the second buildup layer.

In Example 4, the subject matter of Example 3 optionally includes the second buildup layer including at least one via connected to the at least one discrete passive component and extending to a bottom surface of the substrate.

In Example 5, the subject matter of one or both of Examples 1 and 2 optionally includes a second buildup layer contacting the bottom surface of the glass core layer, and a third buildup layer contacting a top surface of the mold layer, wherein the third buildup layer includes electrically conductive interconnect and the at least one top surface active component die is attached to the electrically conductive interconnect of the third buildup layer.

In Example 6, the subject matter of Example 5 optionally includes one or more copper pillars that extend from the first buildup layer through the mold layer and third build up layer to the top surface of the substrate, wherein the at least one top surface active component die is electrically connected to the one or more copper pillars.

In Example 7, the subject matter of one or any combination of Examples 1-6 optionally includes at least one multi-die interconnect bridge disposed in the first buildup layer and connecting the at least one discrete passive component and the at least one mold layer active component die.

In Example 8, the subject matter of one or any combination of Examples 1-7 optionally includes at least one discrete passive component including a discrete capacitor, and at least one mold layer active component die including an input/output (I/O) component die.

In Example 9, the subject matter of one or any combination of Examples 1-8 optionally includes a multi-die interconnect bridge including a bottom surface electrically connected to the at least one discrete passive component and a top surface electrically connected to the at least one mold layer active component die.

In Example 10, the subject matter of one or any combination of Examples 1-9 optionally includes a glass core layer including multiple glass core layer active component dies and multiple discrete passive components disposed in the multiple cavities. The mold layer includes multiple mold layer active component dies, and the height of the mold layer is a uniform height. The subject matter optionally includes multiple top surface active component dies electrically connected to the glass core layer active component dies and the mold layer active component dies.

In Example 11, the subject matter of Example 10 optionally includes multiple top surface active component dies electrically connected to the glass core layer active component dies and the mold layer active component dies.

Example 12 includes subject matter (method of making a substrate for an electronic system) or can optionally be combined with one or any combination of Examples 1-11 to include such subject matter, comprising forming multiple cavities in a glass core layer of the substrate, forming a first buildup layer of dielectric material on a first surface of the glass core layer, disposing at least one glass core layer active component die in at least one cavity of the multiple cavities and disposing at least one discrete passive component in at least one other cavity of the cavities of the multiple cavity, forming a layer of electrically conductive interconnect in the first buildup layer including die bonding pads, disposing at least one mold layer active component die on the first buildup layer attached to at least a portion of the die bonding pads of the first buildup layer, and disposing a mold material on the first buildup layer to encapsulate the at least one mold layer active component die.

In Example 13, the subject matter of Example 12, optionally includes forming a second buildup layer of dielectric material on a second surface of the glass core layer, extending one or more of the multiple cavities of the glass core layer into at least one cavity portion of the second buildup layer, disposing the at least one active component die in the at least one cavity portion of the second buildup layer, and disposing the at least one discrete passive component on a surface of the second buildup layer.

In Example 14, the subject matter of one or both of Examples 12 and 13 optionally includes forming a third buildup layer on a surface of the mold layer. The third buildup layer includes die bonding pads on a surface of the third buildup layer that is a top surface of the substrate.

In Example 15, the subject matter of Example 14 optionally includes forming one or more copper pillars that extend from the first buildup layer through the mold layer to the top surface of the third buildup layer, and forming a die bonding pad of the third buildup layer on one or more of the copper pillars.

In Example 16, the subject matter of one or any combination of Examples 12-15 optionally includes disposing at least one multi-die interconnect bridge in the first buildup layer; and electrically connecting the at least one discrete passive component to the at least one mold layer active component die using the multi-die interconnect bridge.

In Example 17, the subject matter of one or any combination of Examples 12-16 optionally includes disposing a high bandwidth memory (HBM) component in the at least one cavity and disposing at least one discrete inductor in the at least one other cavity, and disposing at least one input/output (I/O) component die on the first buildup layer.

Example 18 includes subject matter (such as a substrate for an electronic system) or can optionally be combined with one or any combination of Examples 1-17 to include such subject matter, comprising a glass core layer including multiple cavities in the glass core layer; multiple high bandwidth memory (HBM) components, a high bandwidth memory component disposed in each cavity of a first portion of the multiple cavities; multiple discrete inductors, a discrete inductor disposed in each cavity of a second portion of the multiple cavities; multiple input/output (I/O) component dies arranged in a mold layer, the mold layer having a first surface facing a surface of the glass core layer; a multi-die interconnect bridge connecting the multiple discrete inductors to the multiple I/O component dies; and a first redistribution layer arranged on a second surface of the mold layer and including electrically conductive interconnect, the electrically conductive interconnect including multiple die bonding pads on a top surface of the first redistribution layer.

In Example 19, the subject matter of Example 18 optionally includes multiple copper pillars that extend through the mold layer and the first redistribution layer. At least one copper pillar contacts a die bonding pad on the top surface of the first redistribution layer.

In Example 20, the subject matter of Example 19 optionally includes a second redistribution layer arranged between the glass core layer and the mold layer and including electrically conductive interconnect. The electrically conductive interconnect of the second redistribution layer provides electrical continuity between the multiple HBM components and the copper pillars, and the copper pillars provide electrical continuity from the electrically conductive interconnect of the second redistribution layer to one or more of the multiple die bonding pads on the top surface of the first redistribution layer.

These non-limiting example embodiments can be combined in any permutation or combination. Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed is:
1. An electronic system, comprising:
a substrate comprising:
  a glass core layer comprising multiple cavities formed through the glass core layer;
  at least one glass core layer active component die in a cavity of the multiple cavities;

at least one discrete passive component in another cavity of the multiple cavities;

a mold layer comprising at least one mold layer active component die in the mold layer; and a first buildup layer contacting a top surface of the glass core layer and a bottom surface of the mold layer and comprising electrically conductive interconnects connecting the at least one glass core layer active component die, the at least one discrete passive component, and the at least one mold layer active component die; and at least one top surface active component die attached to the top surface of the substrate and electrically connected to the at least one mold layer active component die.

2. The electronic system of claim 1, wherein the at least one glass core layer active component die is a high bandwidth memory (HBM) component, the at least one discrete passive component is a discrete inductor, the at least one mold layer active component die is an input/output (I/O) component die, and the at least one top surface active component die is a compute component die.

3. The electronic system of claim 1, comprising a second buildup layer contacting bottom surface of the glass core layer, wherein the at least one glass core layer active component die extends outside the glass core layer into the second buildup layer and the at least one discrete passive component contacts the top surface of the second buildup layer.

4. The electronic system of claim 3, wherein the second buildup layer comprises at least one via connected to the at least one discrete passive component and extending to a bottom surface of the substrate.

5. The electronic system of claim 1, comprising:

a second buildup layer contacting the bottom surface of the glass core layer; and a third buildup layer contacting a top surface of the mold layer, wherein the third buildup layer comprises electrically conductive interconnects and the at least one top surface active component die is attached to the electrically conductive interconnects of the third buildup layer.

6. The electronic system of claim 5, comprising one or more copper pillars that extend from the first buildup layer through the mold layer and the third buildup layer to the top surface of the substrate, wherein the at least one top surface active component die is electrically connected to the one or more copper pillars.

7. The electronic system of claim 1, comprising at least one multi-die interconnect bridge in the first buildup layer and connecting the at least one discrete passive component and the at least one mold layer active component die.

8. The electronic system of claim 7, wherein the at least one discrete passive component is a discrete capacitor, and the at least one mold layer active component die is an input/output (I/O) component die.

9. The electronic system of claim 7, wherein the multi-die interconnect bridge comprises a bottom surface electrically connected to the at least one discrete passive component and a top surface electrically connected to the at least one mold layer active component die.

10. The electronic system of claim 1, wherein the glass core layer comprises multiple glass core layer active component dies and multiple discrete passive components in the multiple cavities, a bottom surface of the substrate comprises a bonding pad electrically connected to the at least one discrete passive component of the multiple discrete passive components, the mold layer comprises multiple mold layer active component dies, a height of the mold layer is a uniform height, and wherein at least one top surface active component die comprises multiple top surface active component dies electrically connected to the glass core layer active component dies and the mold layer active component dies.

11. The electronic system of claim 10, comprising at least one multi-die interconnect bridge electrically connected to at least two discrete passive components of the multiple discrete passive components and at least two mold layer component dies of the multiple mold layer active component dies.

12. A method of making a substrate for an electronic system, comprising:

forming multiple cavities in a glass core layer of the substrate;

forming a first buildup layer of dielectric material on a first surface of the glass core layer;

disposing at least one glass core layer active component die in at least one cavity of the multiple cavities and disposing at least one discrete passive component in at least one other cavity of the cavities of the multiple cavities;

forming a layer of electrically conductive interconnects in the first buildup layer comprising die bonding pads;

disposing at least one mold layer active component die on the first buildup layer attached to at least a portion of the die bonding pads of the first buildup layer; and disposing a mold material on the first buildup layer to encapsulate the at least one mold layer active component die.

13. The method of claim 12, comprising:

forming a second buildup layer of dielectric material on a second surface of the glass core layer; and extending one or more of the multiple cavities of the glass core layer into at least one cavity portion of the second buildup layer, wherein the disposing the at least one glass core layer active component die and the at least one discrete passive component comprises disposing the at least one glass core layer active component die in the at least one cavity portion of the second buildup layer, and disposing the at least one discrete passive component on a surface of the second buildup layer.

14. The method of claim 12, comprising:

forming a third buildup layer on a surface of the mold material, wherein the third buildup layer comprises die bonding pads on a surface of the third buildup layer that is a top surface of the substrate.

15. The method of claim 14, comprising:

forming one or more copper pillars that extend from the first buildup layer through the mold material to the top surface of the third buildup layer; and forming a die bonding pad of the third buildup layer on one or more of the copper pillars.

16. The method of claim 12, wherein the forming the layer of electrically conductive interconnects comprises:

disposing at least one multi-die interconnect bridge in the first buildup layer; and electrically connecting the at least one discrete passive component to the at least one mold layer active component die using the multi-die interconnect bridge.

17. The method of claim 12, wherein the disposing the at least one glass core layer active component die and at least one discrete passive component comprises:

disposing a high bandwidth memory (HBM) component in the at least one cavity and disposing at least one discrete inductor in the at least one other cavity, wherein the disposing at least one mold layer active component die comprises disposing at least one input/output (I/O) component die on the first buildup layer.

18. A substrate for an electronic system, the substrate comprising:

a glass core layer comprising multiple cavities in the glass core layer;

multiple high bandwidth memory (HBM) components, a high bandwidth memory component in each cavity of a first portion of the multiple cavities;

multiple discrete inductors, a discrete inductor in each cavity of a second portion of the multiple cavities;

multiple input/output (I/O) component dies arranged in a mold layer, the mold layer having a first surface facing a surface of the glass core layer;

a multi-die interconnect bridge connecting the multiple discrete inductors to the multiple I/O component dies; and a first redistribution layer arranged on a second surface of the mold layer and comprising electrically conductive interconnects, the electrically conductive interconnects comprising multiple die bonding pads on a top surface of the first redistribution layer.

19. The substrate of claim 18, comprising multiple copper pillars that extend through the mold layer and the first redistribution layer, wherein at least one of the copper pillars contacts a die bonding pad on the top surface of the first redistribution layer.

20. The substrate of claim 19, comprising:

a second redistribution layer arranged between the glass core layer and the mold layer and comprising electrically conductive interconnects, wherein the electrically conductive interconnects of the second redistribution layer provides electrical continuity between the multiple HBM components and the copper pillars, and the copper pillars provide electrical continuity from the electrically conductive interconnects of the second redistribution layer to one or more of the multiple die bonding pads on the top surface of the first redistribution layer.

* * * * *